(12) United States Patent
Lue

(10) Patent No.: US 7,838,923 B2
(45) Date of Patent: Nov. 23, 2010

(54) LATERAL POCKET IMPLANT CHARGE TRAPPING DEVICES

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 203 days.

(21) Appl. No.: 12/102,410

(22) Filed: Apr. 14, 2008

(65) Prior Publication Data

US 2009/0040829 A1    Feb. 12, 2009

Related U.S. Application Data

(60) Provisional application No. 60/954,819, filed on Aug. 9, 2007, provisional application No. 61/019,519, filed on Jan. 7, 2008.

(51) Int. Cl.
*H01L 29/792* (2006.01)

(52) U.S. Cl. ............... 257/324; 257/335; 257/E29.309; 257/E21.18; 438/287; 438/288

(58) Field of Classification Search ................ 257/324, 257/335, E29.309, E21.18; 438/287, 288
See application file for complete search history.

(56) References Cited

U.S. PATENT DOCUMENTS

| | | | |
|---|---|---|---|
| RE31,083 | E | 11/1982 | DeKeersmaecker et al. |
| 4,630,086 | A | 12/1986 | Sato et al. |
| 5,286,994 | A | 2/1994 | Ozawa et al. |
| 5,319,229 | A | 6/1994 | Shimoji et al. |
| 5,952,692 | A | 9/1999 | Nakazato et al. |
| 6,011,725 | A | 1/2000 | Eitan et al. |
| 6,026,026 | A | 2/2000 | Chan et al. |
| 6,074,917 | A | 6/2000 | Chang et al. |
| 6,169,693 | B1 | 1/2001 | Chan et al. |
| 6,218,700 | B1 | 4/2001 | Papadas et al. |
| 6,469,343 | B1 | 10/2002 | Miura et al. |
| 6,512,696 | B1 | 1/2003 | Fan et al. |
| 6,605,840 | B1 | 8/2003 | Wu et al. |

(Continued)

FOREIGN PATENT DOCUMENTS

EP    0016246    10/1980

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner*—Tu-Tu V Ho
(74) *Attorney, Agent, or Firm*—Haynes Beffel & Wolfeld LLP

(57) ABSTRACT

A charge trapping memory cell is described, having pocket implants along the sides of the channel and having the same conductivity type as the channel, and which implants have a concentration of dopants higher than in the central region of the channel. This effectively disables the channel in the region of non-uniform charge trapping caused by a bird's beak or other anomaly in the charge trapping structure on the side of the channel. The pocket implant can be formed using a process compatible with standard shallow trench isolation processes.

9 Claims, 26 Drawing Sheets

U.S. PATENT DOCUMENTS

| | | |
|---|---|---|
| 6,642,090 B1 | 11/2003 | Fried et al. |
| 6,657,252 B2 | 12/2003 | Fried et al. |
| 6,709,928 B1 | 3/2004 | Jenne et al. |
| 6,720,630 B2 | 4/2004 | Mandelman et al. |
| 6,740,928 B2 | 5/2004 | Yoshii et al. |
| 6,784,480 B2 | 8/2004 | Bhattacharyya |
| 6,812,075 B2 | 11/2004 | Fried et al. |
| 6,815,268 B1 | 11/2004 | Yu et al. |
| 6,815,764 B2 | 11/2004 | Bae et al. |
| 6,818,558 B1 | 11/2004 | Rathor et al. |
| 6,858,906 B2 | 2/2005 | Lee et al. |
| 6,897,533 B1 | 5/2005 | Yang et al. |
| 6,912,163 B2 | 6/2005 | Zheng et al. |
| 6,977,201 B2 | 12/2005 | Jung et al. |
| 7,075,828 B2 | 7/2006 | Lue et al. |
| 7,115,469 B1 | 10/2006 | Halliyal et al. |
| 7,115,942 B2 | 10/2006 | Wang |
| 7,133,313 B2 | 11/2006 | Shih et al. |
| 7,187,590 B2 | 3/2007 | Zous et al. |
| 7,262,084 B2 | 8/2007 | Zhu et al. |
| 7,314,787 B2 | 1/2008 | Yagishita et al. |
| 2003/0030100 A1 | 2/2003 | Lee et al. |
| 2003/0032242 A1 | 2/2003 | Lee et al. |
| 2003/0042534 A1 | 3/2003 | Bhattacharyya |
| 2003/0224564 A1 | 12/2003 | Kang et al. |
| 2004/0079983 A1 | 4/2004 | Chae et al. |
| 2004/0251487 A1 | 12/2004 | Wu et al. |
| 2004/0256679 A1 | 12/2004 | Hu |
| 2005/0006696 A1 | 1/2005 | Noguchi et al. |
| 2005/0023603 A1 | 2/2005 | Eldridge et al. |
| 2005/0062098 A1 | 3/2005 | Mahajani et al. |
| 2005/0093054 A1 | 5/2005 | Jung |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0270849 A1 | 12/2005 | Lue |
| 2005/0281085 A1 | 12/2005 | Wu |
| 2006/0198190 A1 | 9/2006 | Lue |
| 2006/0202252 A1 | 9/2006 | Wang et al. |
| 2006/0258090 A1 | 11/2006 | Bhattacharyya et al. |
| 2006/0261401 A1 | 11/2006 | Bhattacharyya |
| 2007/0012988 A1 | 1/2007 | Bhattacharyya |
| 2007/0031999 A1 | 2/2007 | Ho et al. |
| 2007/0045718 A1 | 3/2007 | Bhattacharyya |
| 2007/0069283 A1 | 3/2007 | Shih et al. |
| 2007/0138539 A1 | 6/2007 | Wu et al. |
| 2008/0009115 A1* | 1/2008 | Willer et al. ............... 438/257 |
| 2008/0099830 A1 | 5/2008 | Lue et al. |
| 2008/0116506 A1 | 5/2008 | Lue |

FOREIGN PATENT DOCUMENTS

| | | |
|---|---|---|
| EP | 1411555 | 4/2004 |
| EP | 01677311 | 7/2006 |
| EP | 01677312 | 7/2006 |
| JP | 11040682 | 2/1999 |
| JP | 2004363329 | 12/2004 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4, (2003).

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM CELLS," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lee, Chang, et al., "A Novel SONOS Structure of SiO2/SiN/Al2O3 with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4, (2003).

Likharev, "Layered Tunnel Barriers for Nonvolatile Memory Devices, "Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38(11) Nov. 19912519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 (Pub. No. EP-01677312) filed on Jan. 3, 2006, 4 pages.

Search Report mailed Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4, (2003).

Tsai et al., "Novel SONOS-Type Nonvolatile Memory Device with Suitable Band Offset in HfAIO Charge-Trapping Layer," Int'l Symp. on VLSI Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch 2-Bit per Cell Flash Memory," IEDM Tech. Dig. 2002, 931-934.

* cited by examiner

LATERAL POCKET IMPLANT CHARGE TRAPPING DEVICES

RELATED APPLICATIONS

The benefit is claimed of U.S. Provisional Patent Application No. 60/954,819 filed 9 Aug. 2007; and of U.S. Provisional Patent Application No. 61/019,519 filed 7 Jan. 2008, both of which are incorporated by reference as if fully set forth herein.

BACKGROUND OF THE INVENTION

1. Field of the Invention

The invention relates generally to nonvolatile memory devices, and in particular to flash memory cells and manufacturing of flash memory devices.

2. Description of Related Art

Flash memory technology includes memory cells that store charge between the channel and gate of a field effect transistor. The charge stored affects the threshold of the transistor, and the changes in threshold due to the stored charge can be sensed to indicate data.

One type of charge storage memory cell in widespread application is known as a floating gate memory cell. In a floating gate memory cell, a floating gate of conductive material, such as a conductive polysilicon, is formed over a tunnel dielectric, and an inter-poly dielectric is formed over the floating gate to isolate it from the word line or control gate of the memory cell. Although this technology has been widely successful, as the sizes of the memory cells and the distances between them shrink, the floating gate technology starts to degrade because of interference between neighboring floating gates.

Another type of memory cell, based on storing charge between the channel and gate of a field effect transistor, uses a dielectric charge trapping structure. In this type of memory cell, a dielectric charge trapping structure is formed over a tunnel dielectric which isolates the dielectric charge trapping structure from the channel, and a top dielectric layer is formed over the charge trapping structure to isolate it from the word line or gate. Representative devices are known as a silicon-oxide-nitride-oxide-silicon SONOS cells. In SONOS-type cells, the charge is stored in discrete traps, and therefore does not have a "self-leveling" characteristic like charge in floating gates. Thus, the variations across the charge trapping structure of the electric fields induced for erase and program operations, and other variations in the structures, result in non-uniform distribution of trapped charges in SONOS-type cells. The non-uniform distribution of charge results in variations in the threshold voltage across the channel.

One popular architecture for implementation of charge trapping memory devices is known as a NAND array. See, for example, FIGS. 19-21 of U.S. Patent Application Publication No. 2005/0006696A1, entitled "Semiconductor Memory," by Noguchi et al. As explained below, NAND array-type devices exhibit non-uniform charge trapping.

Non-uniformities in the distribution of charge along the channel length direction are less problematic because the device threshold will be dominated by the local maximum threshold. However, non-uniform distribution of charge along the channel width in the dielectric charge trapping structure can result in regions along the edge of the memory cell with a lower threshold voltage, while regions toward the center of the channel have a higher threshold, or vice-versa. The different threshold regions along the sides can result in problems with program and erase characteristics and with reliability. For example, a lower threshold region along the sides of the channel can result in current flow along the sides, when the cell is intended to have a high threshold, during a process for sensing in the memory cell. As a result, the margin for sensing the states of the memory cells must be expanded to account for these variations. If the current flow on the sides of the cell is high enough, then sensing errors occur.

As the widths of the channels of memory cells decrease with advanced manufacturing technologies, and the trend for greater densities of memory cells, the problem of the non-uniform threshold due to variations in charge trapping along the sides of the channels is amplified, as it becomes a greater percentage of the overall channel width.

Recently, we proposed BE-SONOS [H. T. Lue et al, in IEDM Tech. Dig., 2005, pp. 547-550.] to solve NAND scaling problems below 30 nm nodes. Compared with the conventional SONOS, BE-SONOS uses a thin ONO tunneling barrier that allows hole tunneling during erase, while eliminating the direct tunneling leakage under the louver electric fields encountered during the periods of time in which charge retention is needed.

Therefore, it is desirable to provide a technology to address the problems with non-uniform charge concentration in the charge trapping structure along the channel width dimension.

SUMMARY OF THE INVENTION

The present invention provides a charge trapping memory cell having a pocket implant along the sides of the channel, called herein a lateral pocket implant. The lateral pocket implant has the same conductivity type as the channel, and establishes a concentration of dopants higher in the sides than in the central region of the channel. This effectively disables the channel in the region of nonuniform charge trapping caused by a bird's beak or other edge anomaly in the charge trapping structure. A representative process for manufacturing such memory cells is described which is fully compatible with standard shallow trench isolation processes.

Basically, a memory cell as described herein comprises a first source/drain terminal and a second source/drain terminal having a first conductivity type. The channel between the first and second source/drain terminals has a second conductivity type. The charge trapping structure overlies the channel, and a gate overlies the charge trapping structure. The channel length is defined as the length extending between the first and second source/drain terminals. The channel width is defined as orthogonal to the length extending from a first side to a second side of the channel. A lateral pocket of dopants having the second conductivity type the same as the channel is formed along at least one of the first and second sides of the channel, so that the channel has a profile of concentration of dopants of the second conductivity type that is higher in the lateral pocket than in the central region of the channel. For example, the concentration of dopants in the lateral pocket can be high enough to effectively disable the channel along the sides of the channel.

A number of embodiments of the memory cell as described herein include the channel, the charge trapping structure and the gate arranged such that the charge trapping structure has a thickness between the gate and the channel that is greater along at least one side of the device than in the central region. This greater thickness along the sides results in non-uniform charge trapping along the sides of the charge trapping structure, the effects of which can be reduced or eliminated by the lateral pocket implant. For example, when an insulation material is along the sides of the channel, the process for making insulation material and the charge trapping structure may result in anomalies, such as bird's beaks, in the charge trapping structure along the sides which are adjacent insulation material.

Memory cells described herein have a charge trapping structure that includes a multilayer stack including a first tunneling layer on the channel comprising for example, silicon dioxide or silicon oxynitride, a second charge trapping layer on the tunneling layer, such as a layer of silicon nitride, and a blocking layer between the charge trapping layer and the gate. The insulation material along the sides of the channel in memory cells having this charge trapping structure may also comprise silicon oxide or silicon oxynitride.

Examples of the memory cells implemented as described herein include band gap engineered charge trapping structures, such as a multilayer dielectric stack that includes a first multilayer tunneling layer on the channel. The multilayer tunneling layer is implemented using a layer of silicon oxide or silicon oxynitride that is less than 2 nm thick in the central region of the channel, a second layer of silicon nitride that is less than 3 nm thick in the central region, and a third layer comprising silicon oxide or silicon oxynitride that is less than 3.5 nm thick in the central region. The charge trapping layer is formed on the tunneling layer that comprises silicon nitride having a thickness of greater than 5 nm in the central region. The blocking layer is formed between the charge trapping layer and a gate which comprises an insulation material, which has an effective oxide thickness greater than 5 nm in the central region.

An array of memory cells as described above is configured in a NAND array in examples of the technology described herein. Columns of memory cells are separated by insulator-filled trenches. Strips of the semiconductor substrate lie between the insulator-filled trenches, and respectively include series connected memory cells that include a plurality of spaced apart source/drain terminals having a first conductivity type; a plurality of channels between the adjacent source/drain terminals, the channels having a second conductivity type, the channels having channel lengths extending from a first adjacent source/drain terminal to a second adjacent source/drain terminal, and having widths orthogonal to the lengths extending from a first side to a second side of the channel. The channels include lateral pockets of dopants having the second conductivity type along the first and second sides, so that the channels have respective profiles of concentration of dopants of the second conductivity type that are higher in the lateral pockets than in central regions of the channels.

A plurality of charge trapping structures overlie the channels of the devices. A plurality of word lines are arranged in rows over the charge trapping structures and the channels in the strips of the semiconductor substrate. A plurality of bit lines are arranged to connect the corresponding strips of series connected memory cells.

A method for manufacturing an array of memory cells as described above is also provided. The method includes doping a substrate using a conductivity type selected for the channel, with a first concentration of dopants in the regions. A plurality of insulator-filled trenches is formed in the substrate, separated by strips of the semiconductor substrate. Pockets of dopants are implanted in the substrate along the sides of the strips adjacent the plurality of insulator-filled trenches. The pockets have the same conductivity type as the channel, so that the pocket adjacent insulator-filled trenches has a concentration of dopants higher than the concentration of dopants in the central region of the channel. Charge trapping structures are formed over the strips. Word lines are formed and arranged orthogonally with respect to the strips over the charge trapping structures. Source/drain dopants, having a conductivity type opposite to the channel conductivity type, are implanted adjacent the word lines along the strips of the semiconductor body. An array of bit lines is formed over the word lines and the bit lines are arranged to contact the strips of series connected memory cells which result.

A method for forming a plurality of insulator-filled trenches and for implanting said pockets includes first forming an etch mask defining locations of the plurality of insulator-filled trenches. Dopant having the same conductivity type as the channel is implanted using the etch mask to form pockets which underlie the edges of the masks. Next, the plurality of trenches are etched using the etch masks, leaving portions of the pockets which underlie the edges of the masks in the strip of semiconductor material between the trenches. The trenches are then filled with an insulation material.

Fast erase speed and good data retention can be simultaneously achieved by devices described herein.

Also, NAND flash devices with critical dimensions below 20 nm are described in which the number of storage electrons falls under 100. Also, high density NAND flash using self-boosting and ISSP programming is described.

More aspects and advantages of the present invention can be seen on review of the drawings, the detailed description and the claims, which follow.

DETAILED DESCRIPTION

A detailed description of embodiments of the present invention is provided with reference to the FIGS. 1 through 18a-18c.

Figure 1:
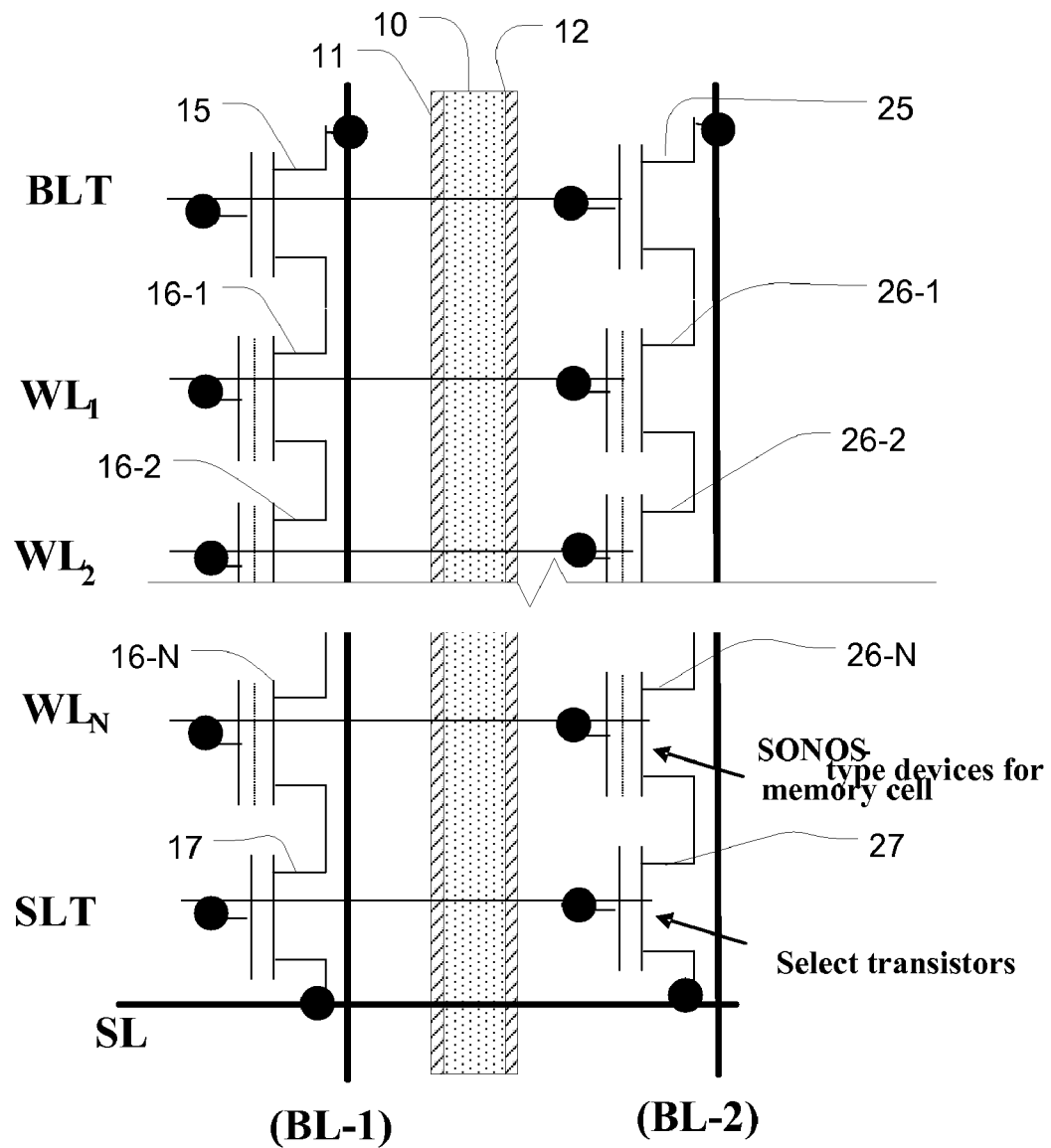
FIG. 1 is a schematic diagram of a NAND architecture memory array including insulation filled trenches between the columns, and implanted lateral pockets.

FIG. 1 is schematic illustration of a portion of a NAND array showing shallow trench isolation schematically in region 10 and lateral pocket implants in regions 11, 12 as described herein. Memory cells are arranged in a plurality of NAND strings, where a first NAND string in FIG. 1 includes memory cells 16-1 through 16-N connected in series and a second NAND string includes memory cells 26-1 through 26-N connected in series, where N may be 16 or 32 or higher. A corresponding set of word lines $WL_1$ through $WL_N$ is coupled to respective memory cells within the NAND strings. A NAND string is selected by controlling the block transistors 15, 25 using the control line BLT to connect the series of memory cells to a bit line BL-1, BL-2, and source select transistors 17, 27 using the control line SLT to connect the series of memory cells to a reference line SL. The word line connect to the selected cell is set to a relatively low voltage, while all of the other word lines are set to a relatively high voltage, sufficient to turn on even high threshold cells. The state of the selected memory cell can be detected by determining whether the word line voltage on the selected word line is high enough to turn the cell on, according to logic analogous to the operation of a NAND gate.

A common technology for implementation of a NAND array includes the use of shallow trench isolation STI structures, schematically represented by the region 10 in FIG. 1, between strips of the semiconductor substrate in which a series of memory cells is implemented. The memory cells include channel regions having one of n-type doping (for p-channel devices) or p-type doping (for n-channel devices), and source/drain regions between the channel regions along the strip having the opposite conductivity type. Charge trapping structures are formed over the channel regions, and word lines and bit lines are patterned to establish access to the NAND cells.

As described herein, lateral pocket implants schematically represented by the regions 11, 12 in FIG. 1 are formed along the sides of the memory cells adjacent the STI structures in order to effectively disable regions of the channel along the sides that are normally subject to the effects of non-uniform charge distribution.

Figure 2A:
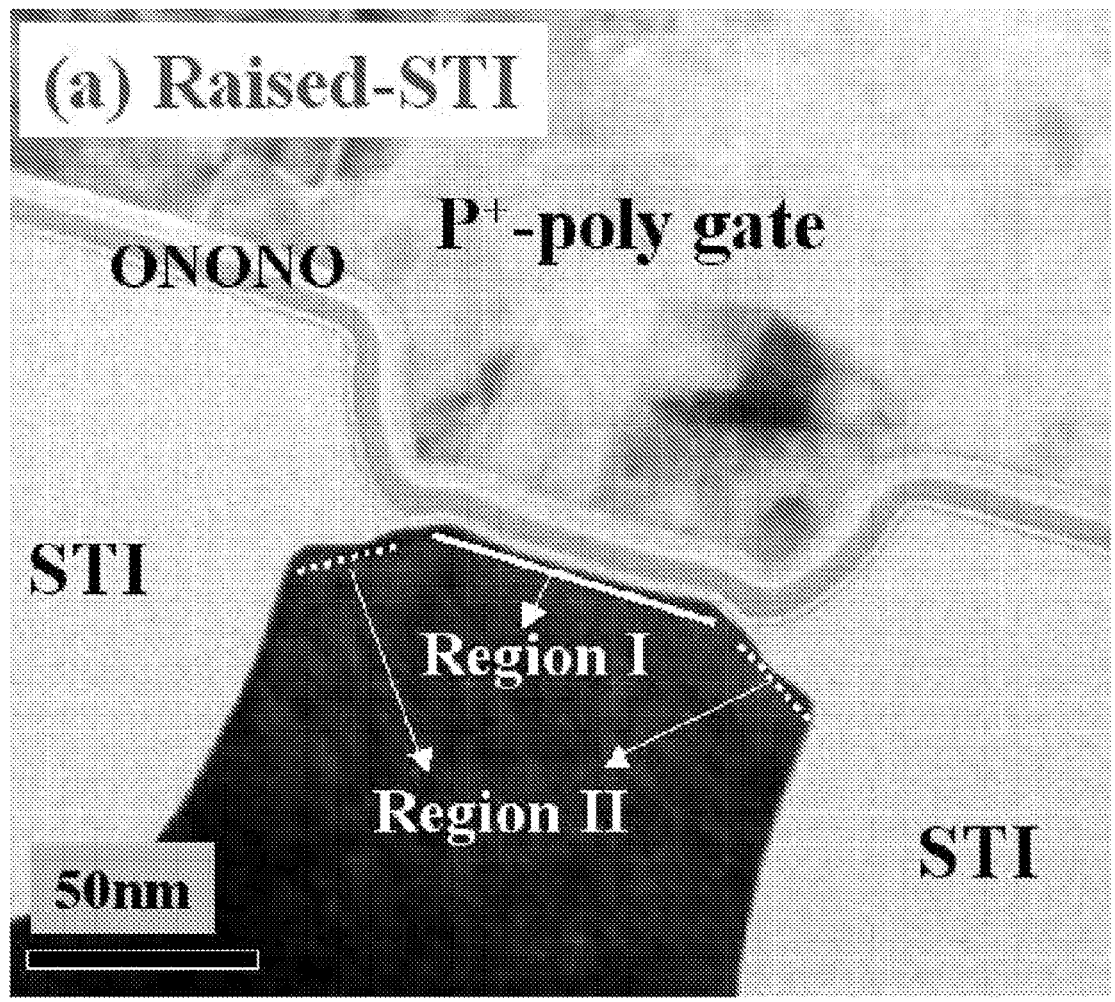
FIG. 2A is a TEM image of a cross-section across the channel width of raised STI, bandgap engineered dielectric charge trapping device, showing regions of non-uniform electric fields.
Figure 2B:
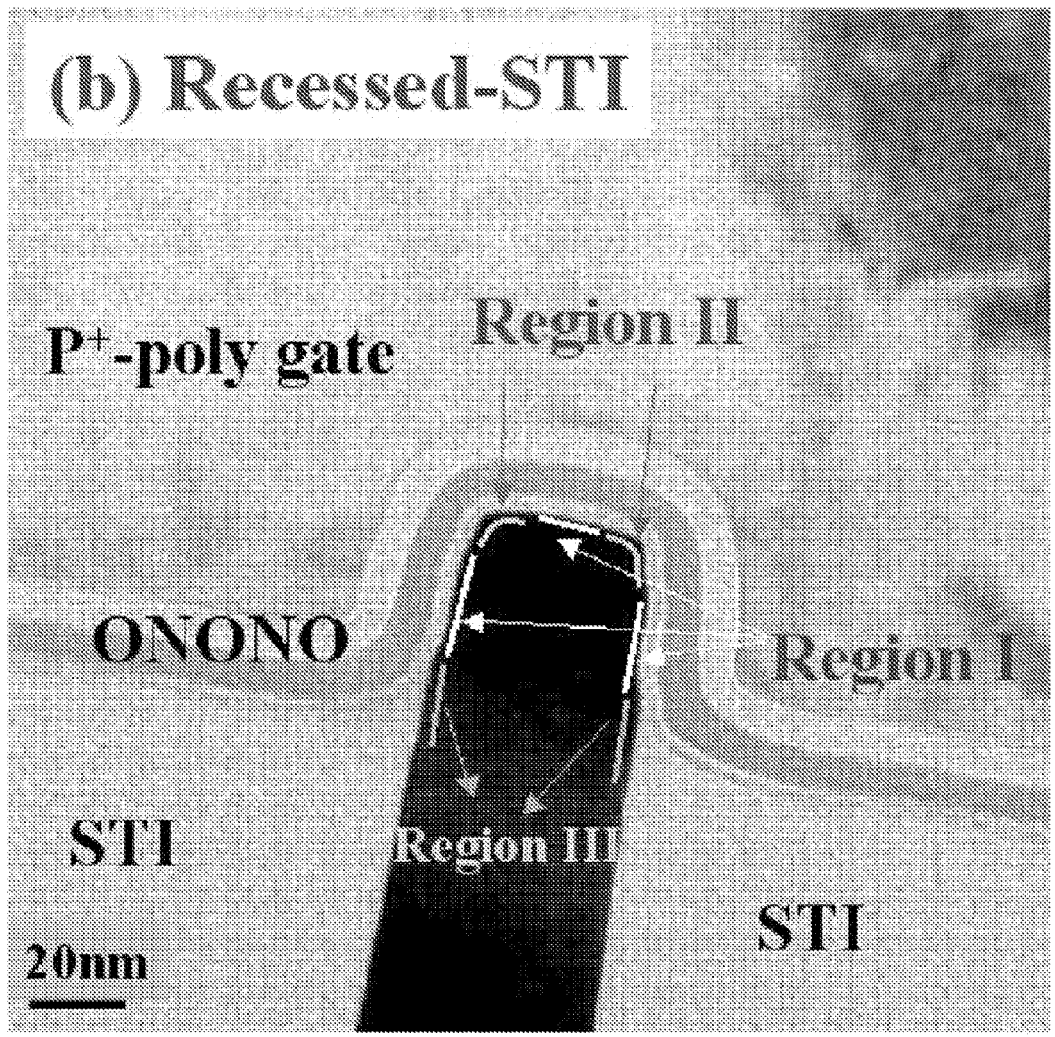
FIG. 2B is a TEM image of a cross-section across the channel width of a recessed STI, bandgap engineered dielectric charge trapping device, showing regions of non-uniform electric fields.
Figure 2C:
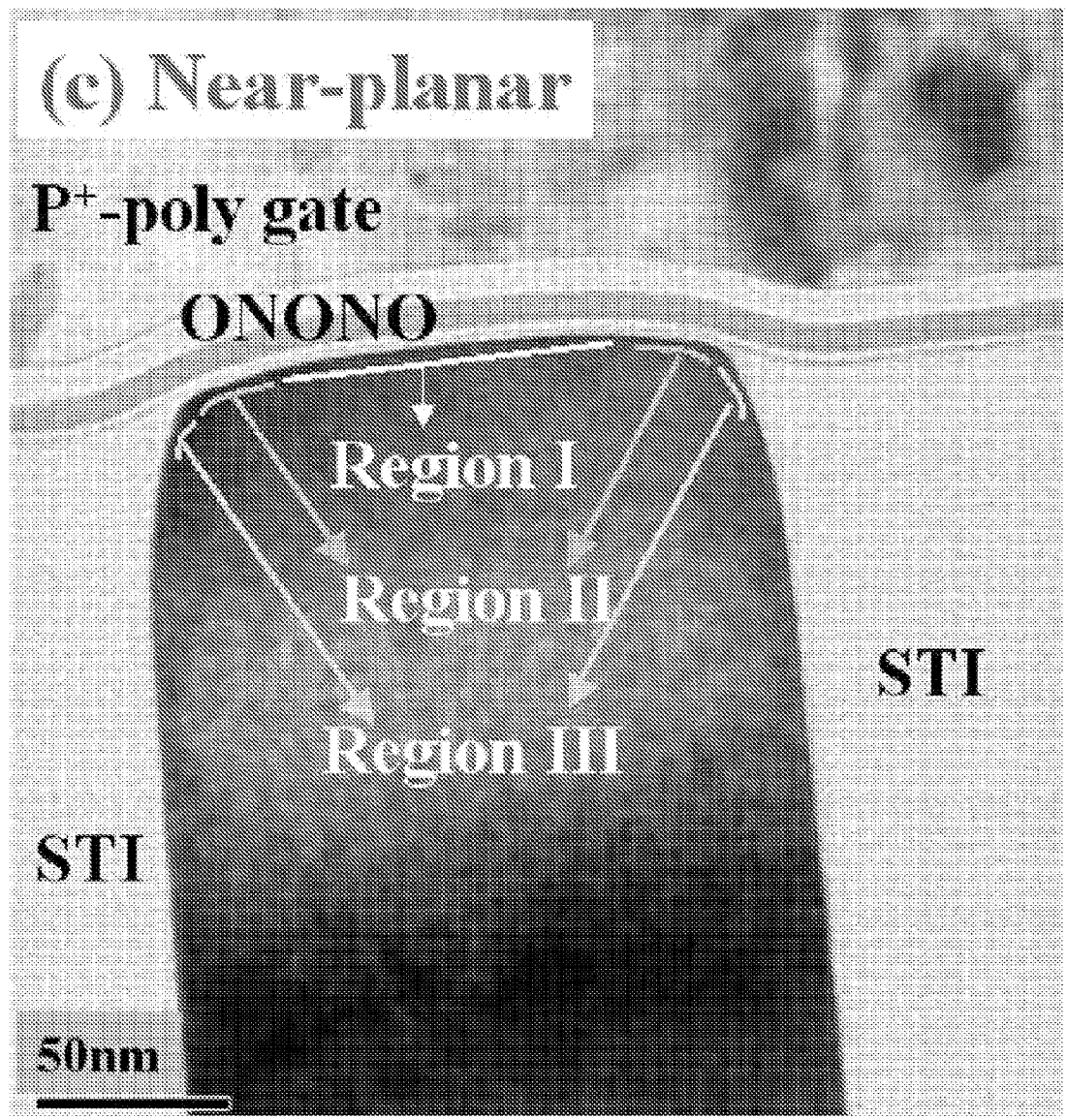
FIG. 2C is a TEM image of a cross-section across the channel width of a near-planar STI, bandgap engineered dielectric charge trapping device, showing regions of non-uniform electric fields.

FIGS. 2A to 2C are transmission electron microscope TEM photographs of three types of STI-based structures which have been used to form NAND arrays. In FIG. 2A, a "raised" STI structure is illustrated. The purpose of the raised STI structure is to reduce the edge electric field, and is commonly used in floating gate type devices. In FIG. 2B, a "recessed" STI structure is illustrated. The recessed STI structure results in a memory cell similar to a FinFET, and is expected to provide better gate control capabilities. In FIG. 2C, a "near-planar" STI structure is illustrated. The near-planar STI structure is expected to be the best candidate for scaling down the memory cell structure, because it does not have problems associated with gap filling and the like.

FIG. 2A shows a "raised-STI" structure with shallow trench isolation structures, labeled STI, on either side of a semiconductor channel member which is dark in color. A charge trapping structure over the channel member, and over the STI structures, is labeled ONONO. The charge trapping structure in the image comprises a bandgap engineered tunneling layer including a first layer of silicon dioxide less than 2 nm thick (such as about 13 Å), a first layer of silicon nitride less than 3 nm thick (such as about 20 Å), a second layer of silicon dioxide less than 3.5 nm thick (such as about 25 Å), the charge trapping layer of silicon nitride greater than 5 nm thick (such as about 70 Å), and a blocking layer of silicon dioxide greater than 5 nm thick (such as about 90 Å). A layer of p-type doped polysilicon overlies the charge trapping structure, and is labeled "P+-poly gate." The channel member includes labels identifying "Region I" and "Region II" on the channel surface adjacent the charge trapping structure. Region I is the local relatively planar region across the top of the channel where the thicknesses of the materials across the charge trapping structure are relatively uniform. Region II includes the corners of the channel on either side of Region I. In the raised-STI structure in FIG. 2A, Region II is exposed to reduced electric fields during operation relative to Region I, and bird's beak encroachment expands the thicknesses of the oxide layers in the charge trapping structure. Thus, the cell threshold in Region II is likely to remain relatively low relative to the cell threshold in Region I, in a high threshold state. According to the technology described herein, lateral pocket implants are used to reduce the influence on operation of the cell of the non-uniformity in at least part of Region II for the structure in FIG. 2A.

FIG. 2B shows a "recessed-STI" structure with shallow trench isolation structures, labeled STI, on either side of a semiconductor channel member which is dark in color. A charge trapping structure over the channel member and over the STI structures, labeled ONONO, is implemented like that in the structure of FIG. 2A. A layer of polysilicon overlies the charge trapping structure, and is labeled "P+-poly gate." The channel member includes labels identifying "Region I", "Region II" and "Region III" on the channel surface adjacent the charge trapping structure. Region I is the local relatively planar region across the top and on the flat sides of the channel where the thicknesses of the materials across the charge trapping structure are relatively uniform. Region II includes the top corners of the channel on either side of the part of Region I on the top of the channel structure. Region III is the outermost region on the side wall where gate control capability is very weak. In the recessed-STI structure in FIG. 2B, Region II is exposed to enhanced electric fields during operation relative to Region I. Region III is exposed to decreased electric fields during operation relative to Region I, and bird's beak encroachment expands the thicknesses of the oxide layers in the charge trapping structure. Thus, the cell threshold in Region III is likely to remain relatively low relative to the cell threshold in Regions I and II, in a high threshold state. According to the technology described herein, lateral pocket implants are used reduce the influence on operation of the cell of the non-uniformity in at least part of Region III for the structure in FIG. 2B.

FIG. 2C shows a "near-planar-STI" structure with shallow trench isolation structures, labeled STI, on either side of a semiconductor channel member which is dark in color. A charge trapping structure over the channel member and over the STI structures, labeled ONONO, is implemented like that in the structure of FIG. 2A. A layer of polysilicon overlies the charge trapping structure, and is labeled "P+-poly gate." The channel member includes labels identifying "Region I", "Region II" and "Region III" on the channel surface adjacent the charge trapping structure. Region I is the local relatively planar region across the top of the channel where the thicknesses of the materials across the charge trapping structure are relatively uniform. Region II includes the top corners of the channel on either side of the part of Region I on the top of the channel structure. Region III is the most outer region on the side of the channel where gate control capability is very weak, and bird's beak encroachment expands the thicknesses of the oxide layers in the charge trapping structure. In the near-planar-STI structure in FIG. 2C, Region II is exposed to enhanced electric fields during operation relative to Region I. Region III is exposed to decreased electric fields during operation relative to Region I, and to the effects of the thickened oxide layers. Thus, the cell threshold in Region III is likely to remain relatively low relative to the cell threshold in Regions I and II, in a high threshold state. According to the technology described herein, lateral pocket implants are used to reduce the influence on operation of the cell of the non-uniformity in at least part of Region III for the structure in FIG. 2C.

Figure 3:
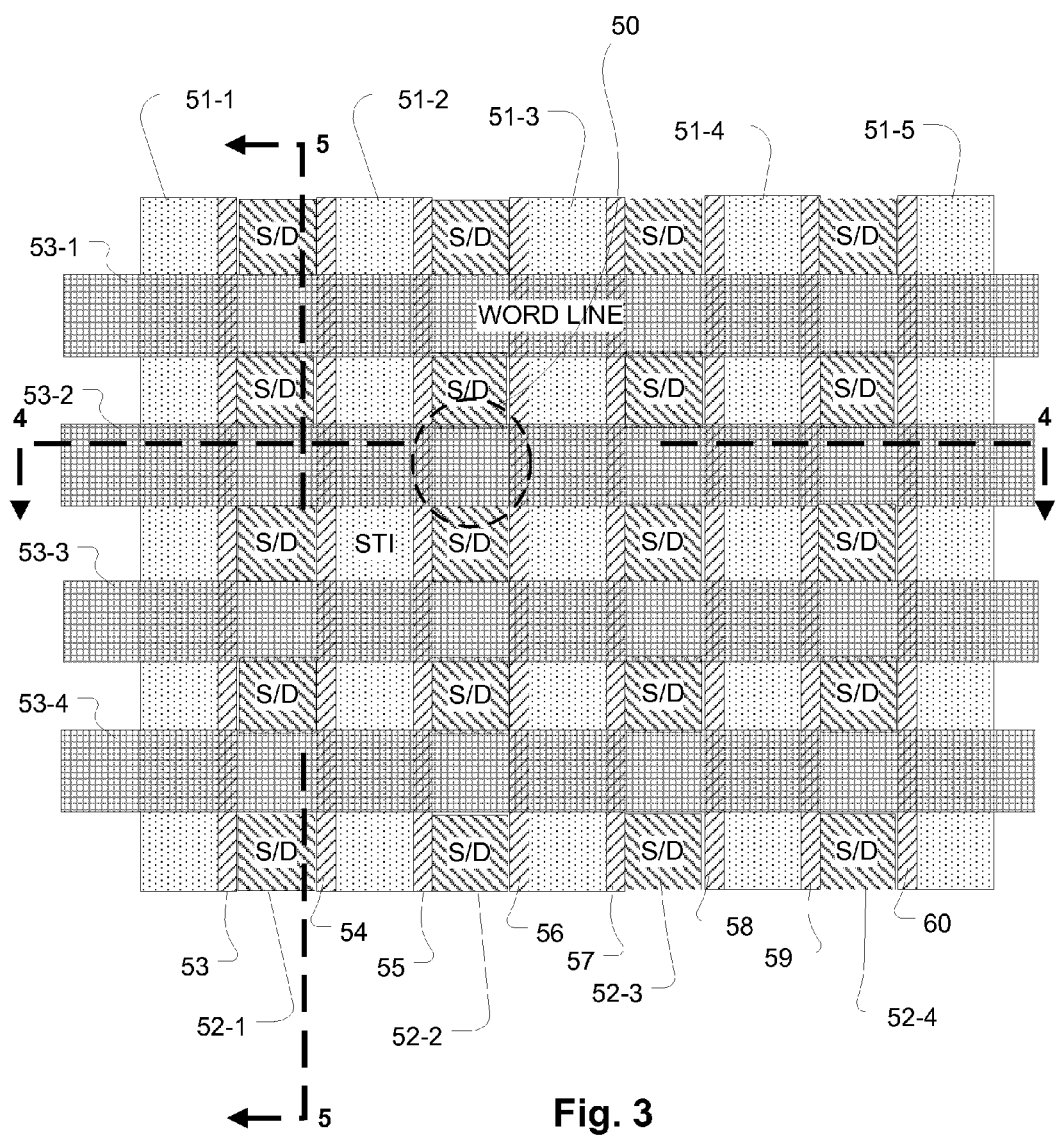
FIG. 3 is a layout view of a NAND array of memory cells, including insulation filled trenches between the columns, and implanted lateral pockets.

FIG. 3 shows a NAND array layout including lateral pocket implants and shallow trench isolation between columns. In the layout, a plurality of insulator filled trenches 51-1 through 51-5 is formed in the semiconductor substrate. Semiconductor strips 52-1 through 52-4 lie between pairs of the insulator filled trenches 51-1 through 51-5. Charge trapping structures, not shown, overlie the semiconductor strips. A plurality of word lines 53-1 through 53-4 are formed over the charge trapping structures, and extend orthogonally relative to the semiconductor strips 52-1 through 52-4. The semiconductor strips include a plurality of source/drain regions (labeled S/D) having a first conductivity type and a plurality of channel regions (beneath the word lines) having a second conductivity type. Lateral pocket implants having a second conductivity type are formed on the semiconductor strips, including pockets 53, 54 on the semiconductor strip 52-1, pockets 55, 56 on the semiconductor strip 52-2, pockets 57, 58 on the semiconductor strip 52-3, and pockets 59, 60 on the semiconductor strip 52-4. In the illustrated embodiment, the lateral pocket implants are made along the length of the strips 52-1 through 52-4, including in the source/drain regions. In alternate embodiments, the source/drain regions may be masked during the implant process, leaving the lateral pocket implants only on the sides of the channels. In yet other embodiments, more specific masking may be applied to locate the lateral pocket implants having the same conductivity type as the channel on specific regions of the surface of the channel in order to mask the effects of a nonuniform distribution across the width of the channel of charge trapping. For example, one alternative embodiment may apply lateral pocket implants in Region II of a "recessed-STI" structure like that of FIG. 2B.

A memory cell, such as shown in FIGS. 2A-2C, is formed where a word line overlies a channel between the source/drain terminals. For example, the memory cell is formed in the region 50 where the word line 53-2 overlies the semiconductor strip 52-2.

As shown in FIGS. 2A-2C, wherein the insulation material in the insulation fill the trenches is silicon dioxide or silicon oxynitride, and the bottom layer in the charge trapping structure is also silicon dioxide or silicon oxynitride, a "bird's beak" encroachment is formed during thermal processes, where the thickness of the bottom layer on the charge trapping structure is increased along the edges. This "bird's beak" phenomenon may occur whenever the insulation material is the same as a material used in the charge trapping structure, or under other circumstances. The "bird's beak" phenomenon causes the non-uniform electric fields to occur and corresponding non-uniform distributions of charge trapping along the edges of the structures. The lateral pocket implants described herein effectively disable, or reduce the influence of, the channel in the region of the "bird's beak" along the sides of the channel, masking the effects of the non-uniform distributions of charge and non-uniform threshold voltages across the width of the channel.

Figure 4:
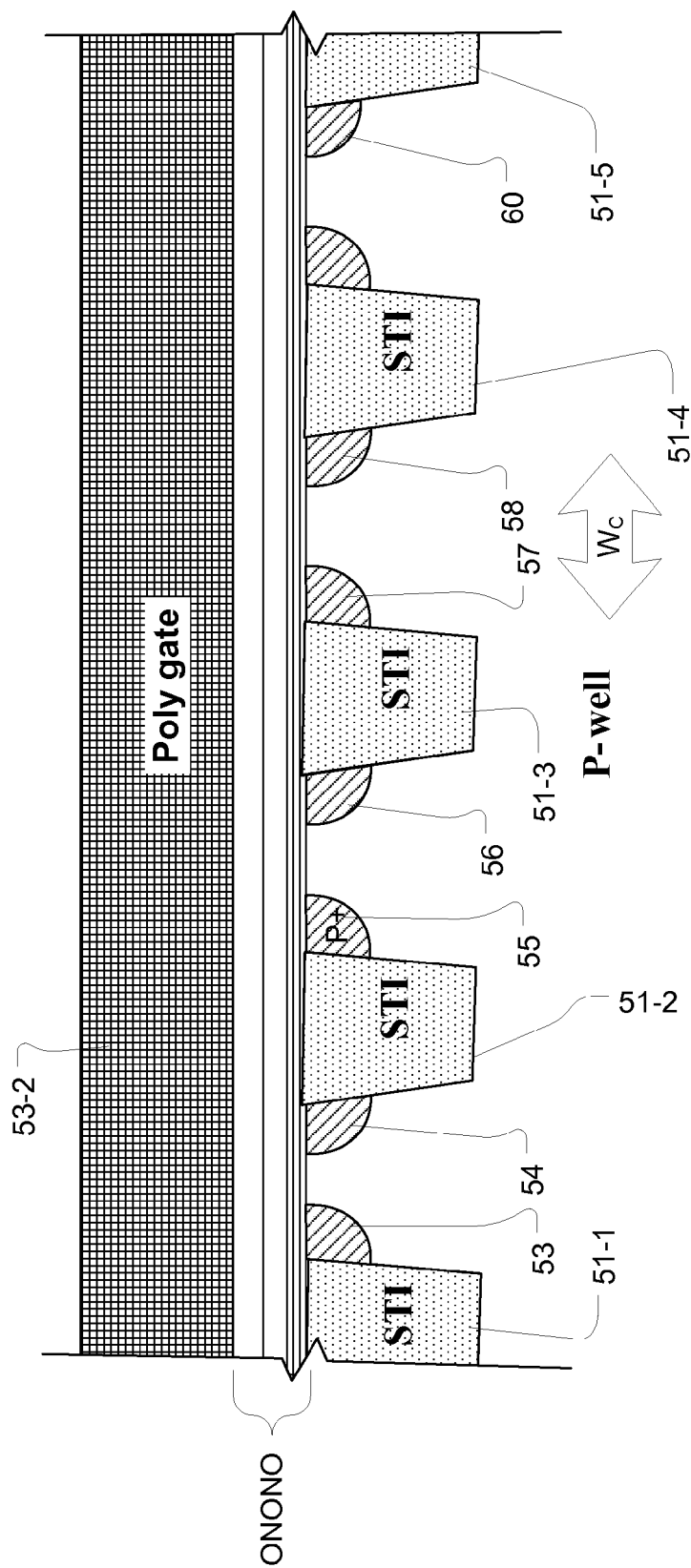
FIG. 4 is cross-section of an NAND array, like that of FIG. 3, using n-channel devices, taken along a word line.

FIG. 4 is a cross-sectional view taken along line 4-4 of FIG. 3. The reference numbers used with reference to the structures in FIG. 3 are repeated for the same structures. As shown in FIG. 4, the array of memory cells is formed on a semiconductor substrate labeled "P-well" in FIG. 4. The insulator filled trenches 51-1 through 51-5 define strips in the semiconductor substrate having the same conductivity type as the P-well. The width of the strips is roughly the width of the channels of the memory cells, and is labeled $W_C$ in FIG. 4. Lateral pockets 53-60, having the same conductivity type as the P-well, increase the concentration of p-type dopants within the lateral pockets 53-60, resulting in a profile of concentration of dopants of the same conductivity type across the channel width $W_C$, that is higher in the pocket than in a central region of the channel. The charge trapping structure in the illustrated embodiment comprises an ONONO multilayer stack as described with reference to FIG. 2A. Alternative memory cells may use different charge trapping structures, including for example a charge trapping structure as described in Shin et al., "A Highly Reliable SONOS-type NAND Flash Memory Cell with Al2O3 or Top Oxide," IEDM, 2003 (MANOS); and Shin et al., "A Novel NAND-type MONOS Memory using 63 nm Process Technology for a Multi-Gigabit Flash EEPROMs", IEEE 2005, and commonly owned and co-pending U.S. patent application Ser.

No. 11/845,276, filed 27 Aug. 2007, which is incorporated by reference as if fully set forth herein.

Figure 5:
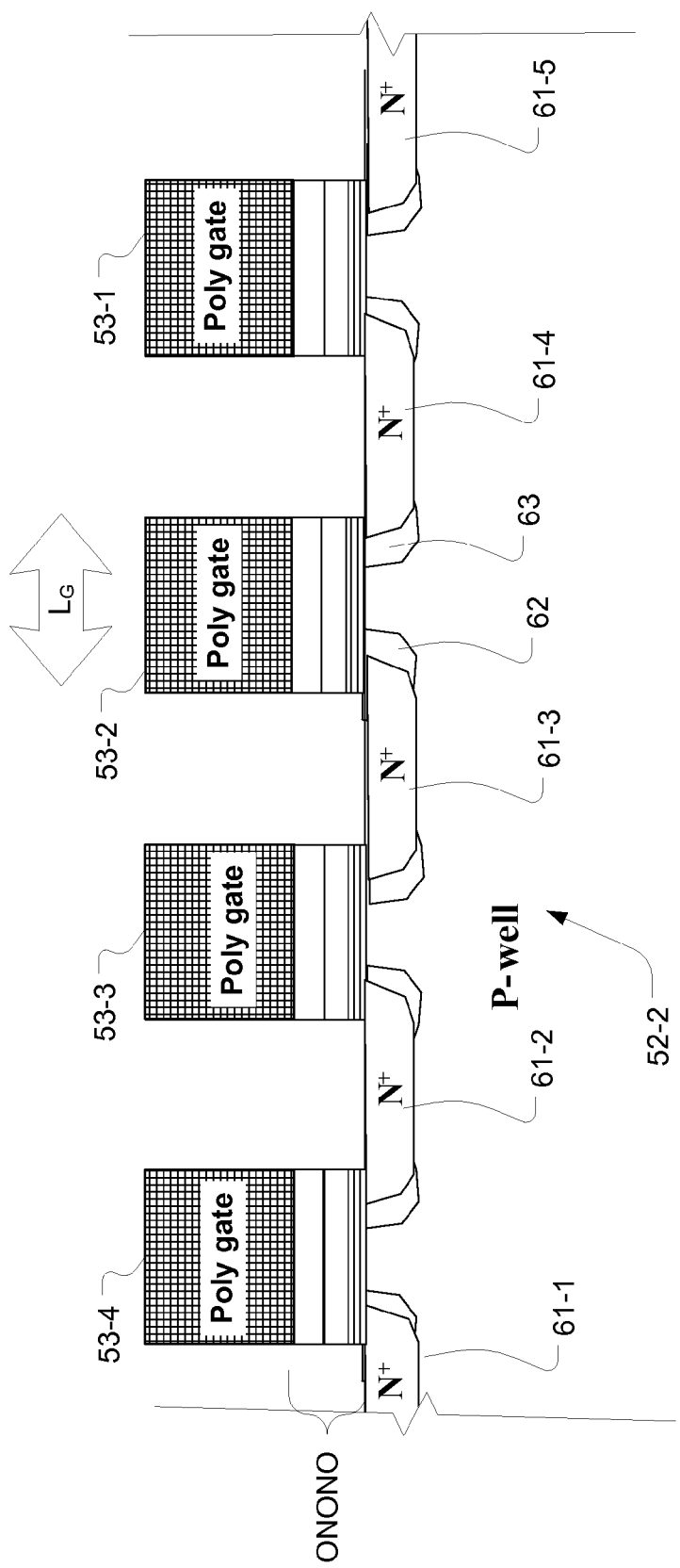
FIG. 5 is cross-section of an NAND array, like that of FIG. 3, using n-channel devices, taken orthogonal to a word line through cell channels.

FIG. 5 is a cross-sectional view taken along line 5-5 of FIG. 3. The reference numbers used with reference to the structures in FIG. 3 are repeated for the same structures. FIG. 5 is a cross-section taken along a strip of the semiconductor body which includes source/drain regions 61-1 through 61-5, with channel regions therebetween forming a plurality of memory cells in series. Word lines 53-1 through 53-4 overlie the strips over the channel regions between respective pairs of the source/drain regions. The charge trapping structure includes the ONONO multilayer stack as described above. For reference, the gate length is labeled $L_G$ in FIG. 5. The gate length is one determinant of the length of the channel between the source/drain terminals of the memory cell, and lies in a dimension orthogonal to the width of the channel $W_C$ which is shown in FIG. 4. FIG. 5 illustrates pockets, such as implanted pockets 62, 63, which are made along the edges of the channel adjacent the source and drain regions. The pockets 62, 63 are used for example to reduce so-called short-channel effects, like punch through. Thus, embodiments of memory cells as described herein may include lateral pockets implanted with the same conductivity type as the channel along the sides of the channel adjacent insulating structures having the same conductivity type as the channel used to eliminate or reduce the effects of non-uniform charge distribution across the width of the channel. And, in addition, implanted pockets, such as the pockets 62, 63 adjacent the source/drain terminals, having either the same conductivity type or the opposite conductivity type as the channel, are used for a variety of reasons.

Alternative embodiments include a plurality of word lines, such as eight or sixteen, between a first n-type source/drain terminal, and a second n-type source/drain terminal, with a continuous p-type channel structure for n-channel devices, and vice versa for p-channel devices. Thus, embodiments of the NAND array as described herein may include more than one gate between the source/drain terminals doped with a conductivity type opposite that of the channel. Individual cells are accessed in this alternative by biasing the adjacent word lines in a manner that inverts the channel structure, creating inversion source/drain regions for individual gates. See, commonly owned, co-pending U.S. patent application Ser. No. 11/394,649 by Hsu et al., filed Mar. 31, 2006, which is incorporated by reference as if fully set forth herein.

Figure 6:
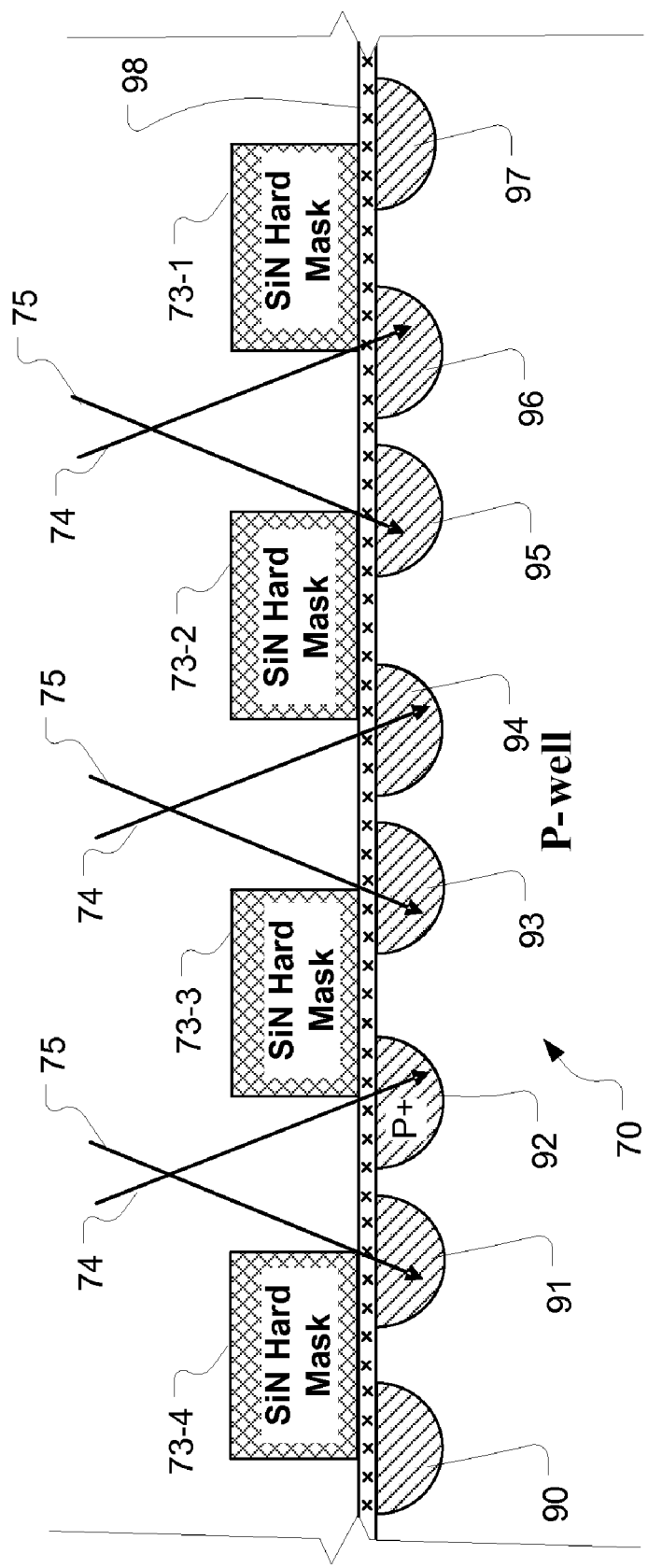
FIG. 6 illustrates a step in a manufacturing process for forming implanted lateral pockets, adjacent STI structures.

FIG. 6 illustrates one stage in a method for manufacturing memory cells including lateral pocket implants along the sides of shallow trench isolation structures. As shown in FIG. 6, a p-type semiconductor substrate 70 having pad oxide layer 98 is provided. An implant mask comprising a plurality of strips 73-1 through 73-4 of silicon nitride or other suitable etch mask material, defines the locations of a plurality of trenches between the masks. Before etching the trenches, ion implantation is performed, using a first step 74 adapted to implant beneath the left sides of the hard masks 73-1 through 73-4 at an angle between about 7° to 30° for example, forming implanted regions 90, 92, 94, 96, and a second step 75 adapted to implant beneath the right sides of the hard masks 73-1 through 73-4 at an angle between about −7° to −30° for example, forming implanted regions 91, 93, 95, 97. The implants use p-type dopants, matching the conductivity type of the substrate. For example, for a p-type substrate, the implant may be made using B, $BF_2$ or In. The dosage is selected so that the local threshold voltage along the sides of the channels, such as beneath the bird's beak as shown and FIG. 2A in Region II, is larger than the local threshold in the central region of the channel. For example, for a substrate, or channel well, doping of about $1E18/cm^3$, the implant dosage could be in a range of about $1E13/cm^2$ to $1E14/cm^2$. For one example, boron ions are implanted with energy about 15 keV, at an implant angle of about 15°, using a dosage of $3E13/cm^2$. In one example, the lateral pocket implant depth may be around 1000 Angstrom, with a dosage is around $2E13/cm^2$. Therefore, the effective doping density is around $2E13/(1000*1E-8)=2E18/cm^3$. The lateral pocket implant in this example, raises the local doping density along the side of the channel, so that the estimated local threshold voltage Vt is larger than ~5 V.

The tilt of the implant angle, the concentration, the energy and the dopant material are selected or adjusted according to the channel width, the structure of the charge trapping layers along the sides, the mask structure used during implantation, and so on, to optimize the effect on the behavior of the cell. The lateral pocket should not extend too far into the center of the channel, but have sufficient extent to mask at least some of the effects of non-uniformity in the charge trapping structure.

After the implant process, rapid thermal anneal RTA processes can be carried out to anneal the dosage. Then, shallow trench isolation etching is carried out, followed by filling the resulting trenches with an insulation material, such as by high density plasma HDP chemical vapor deposition, of silicon dioxide or silicon oxynitride. After filling the trenches, the structure is planarized using chemical mechanical polishing or the like. Then, for a near-planar structure as illustrated in FIG. 2C, the charge trapping structure and word lines are formed. Alternatively, the strips of semiconductor material may be recessed slightly to form a raised STI structure as illustrated FIG. 2A, or the insulation material may be recessed slightly to form the recessed STI structure as illustrated in FIG. 2B.

Figure 7:
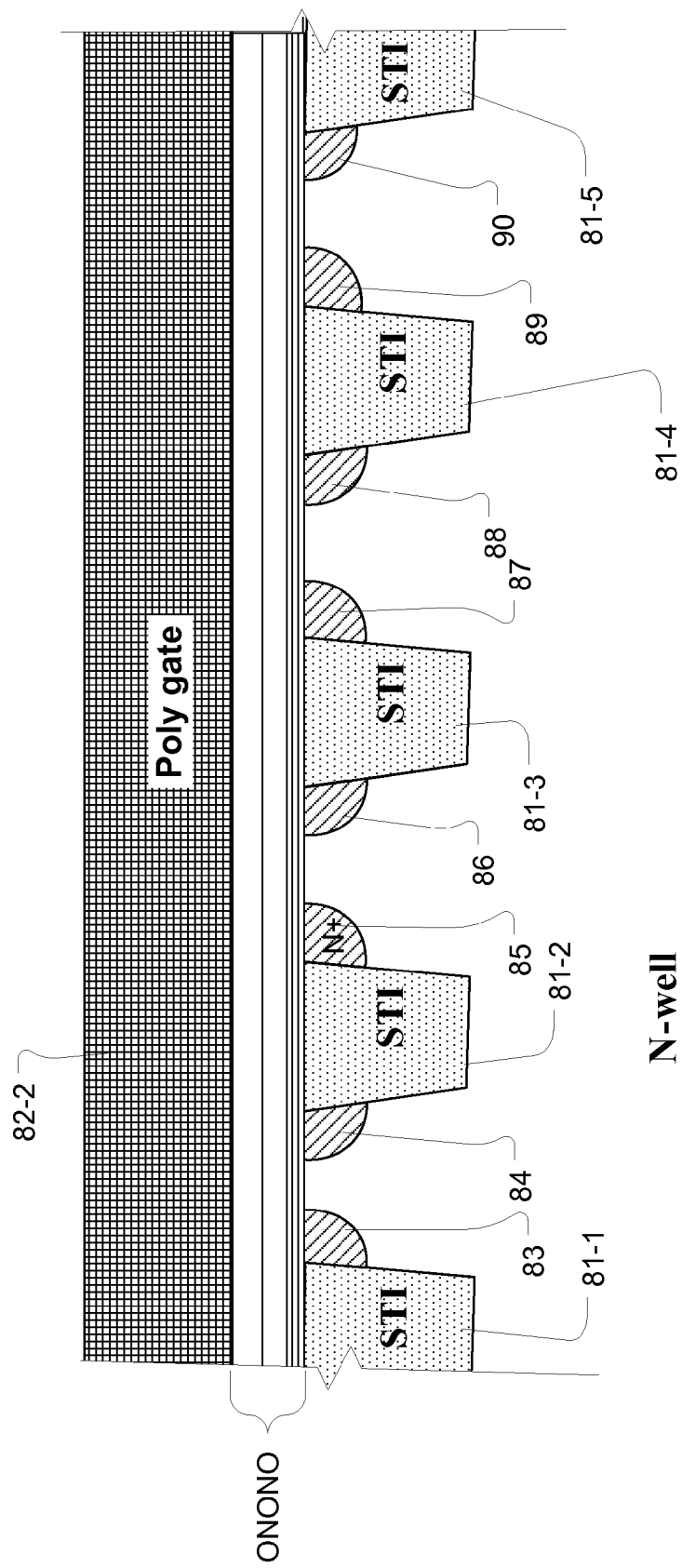
FIG. 7 is cross-section of an NAND array, like that of FIG. 3, using p-channel devices, taken along a word line.

The examples described above with respect to FIGS. 4-6 result in n-channel memory cells. Alternative embodiments using p-channel memory cells can be made, as shown in FIG. 7. FIG. 7 is a cross-sectional view of a p-channel structure, like that of the n-channel structure shown in FIG. 4. As shown in FIG. 7, the array of memory cells is formed on a semiconductor substrate labeled "N-well" in FIG. 7. Shallow trench isolation structures 81-1 through 81-5 define strips in the semiconductor substrate having the same conductivity type as the N-well. The width of the strips is roughly the width of the channels of the memory cells. Lateral pocket implants 83-90 having the same conductivity type as the N-well, increase the concentration of n-type dopants within the lateral pockets 83-90, and result in a profile of concentration of dopants of the same conductivity type across the channel width $W_C$, that is higher in the pocket than in a central region of the channel, and reduce the influence of the channel along the sides adjacent the insulation filled trenches. The charge trapping structure in the illustrated embodiment comprises an ONONO multilayer stack as described with reference to FIG. 2A. A polysilicon word line 82-2 overlies the plurality of strips of semiconductor material between the STI structures.

Figure 8:
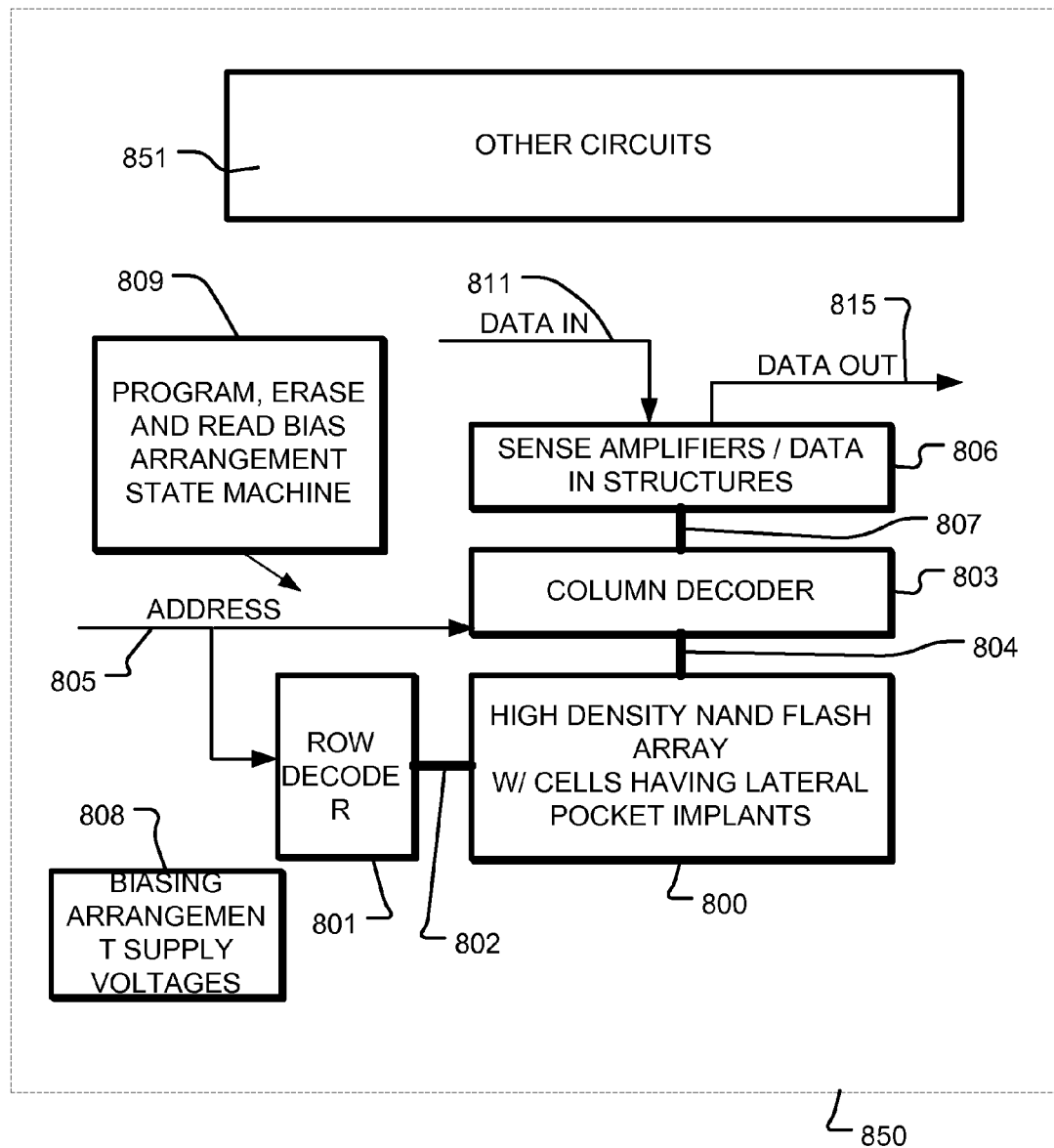
FIG. 8 is a block diagram of an integrated circuit including a NAND architecture memory array with implanted lateral pockets.

FIG. 8 is a simplified block diagram of an integrated circuit 850 employing a NAND array 800 of BE-SONOS memory cells as described herein having lateral pocket implants as described above, and a band gap engineered tunneling dielectric layer. A word line (or row) and block select decoder 801 is coupled to, and in electrical communication with, a plurality 802 of word lines and block select lines, and arranged along rows in the memory array 800. A bit line (column) decoder and drivers 803 are coupled to and in electrical communication with a plurality of bit lines 804 arranged along columns in the memory array 800 for reading data from, and writing data to, the memory cells in the memory array 800.

Addresses are supplied on bus 805 to the word line decoder and drivers 801 and to the bit line decoder 803. Sense amplifiers and data-in structures in block 806, including current sources for the read, program and erase modes, are coupled to the bit line decoder 803 via data bus 807. Data is supplied via the data-in line 811 from input/output ports on the integrated circuit 850 or from other data circuits 851 internal to the integrated circuit to the data-in structures in block 806. In the illustrated embodiment, other circuitry 851 is included on the integrated circuit 850, such as a general purpose processor or special purpose application circuitry, or a combination of modules providing system-on-a-chip functionality supported by the memory cell array. Data is supplied via the data-out line 815 from the sense amplifiers in block 806 to input/output ports on the integrated circuit 850, or to other data destinations internal or external to the integrated circuit 850.

The array 800 can be a NAND array as described above, or other array structures such an AND array or a NOR array, depending on the particular application and structures of the memory cells used.

A controller 809 implemented in this example, using bias arrangement state machine, controls the application of bias arrangement supply voltages and current sources 808, such as read, program, erase, erase verify, program verify voltages or currents for the word lines and bit lines, and controls the word line/source line operation using an access control process. The controller 809 can be implemented using special purpose logic circuitry as known in the art. In alternative embodiments, the controller 809 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 809. Abstract Sub-30 nm and sub-20 nm BE-SONOS NAND Flash memory having good device characteristics are achieved through two innovative processes: (1) a low-energy tilt-angle STI pocket implantation to suppress the STI corner edge effect, and (2) a drain offset using an additional oxide liner to improve the short-channel effect. The conventional self-boosting program-inhibit and ISPP (incremental step pulse programming) for MLC storage are described for 20 nm BE-SONOS NAND operation. Read current stability and read disturb life time are also evaluated. The estimated number of storage electrons is only 50-100, and successful data retention after 150° C. baking in the "few-electron" regime is demonstrated.

Figures 9A, 9B:
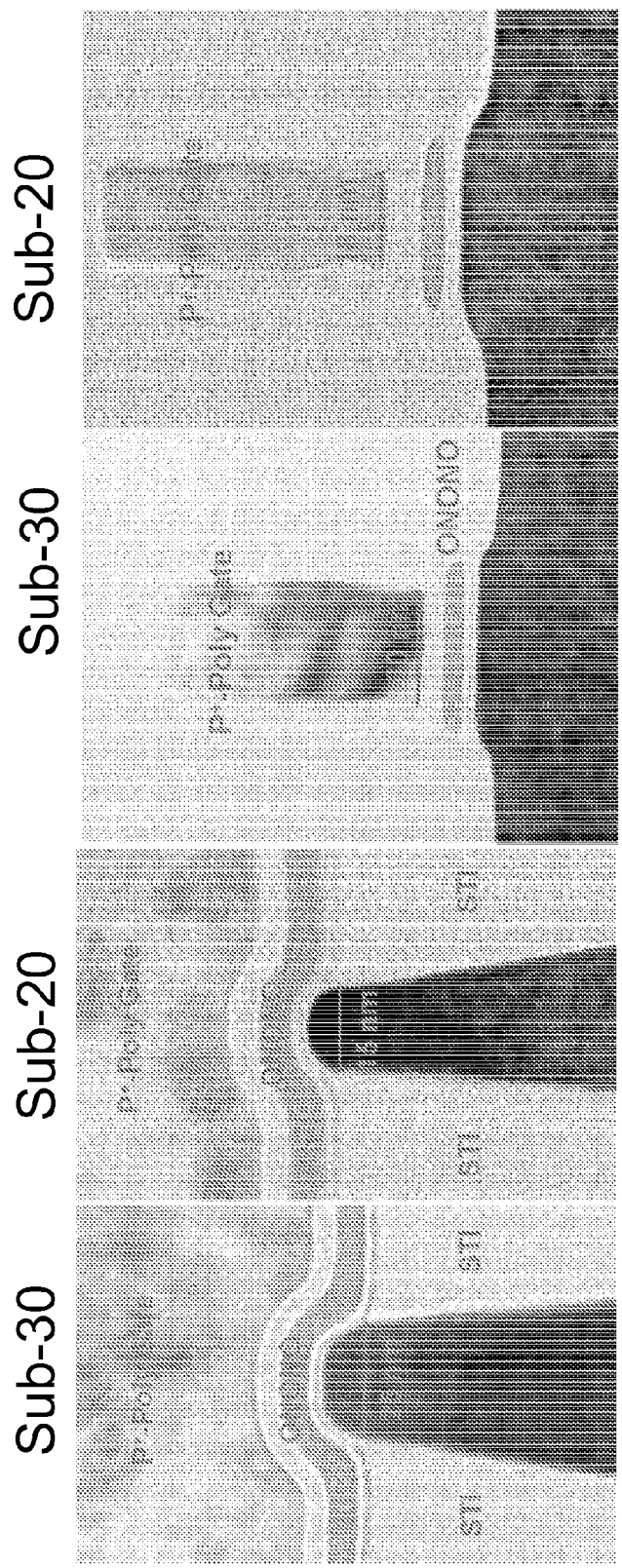
FIGS. 9a-9b. TEM cross-sectional views of the near-planar BE-SONOS devices. (a) channel-width direction. Small STI recess (<10 nm) is obtained. (b) channel-length direction.

Device cross-sectional views for sub-30 and sub-20 nm BE-SONOS devices are shown in FIGS. 9a-9b. Processes to improve the sub-20 nm characteristics include a low-energy tilt-angle STI pocket implantation into the sidewall at the STI corners, and followed by the STI trench etching as described above. A higher p-well doping concentration suppresses the sidewall parasitic transistor and thus reduces the STI edge effect (see, H. T. Lue et al, in IEDM Tech. Dig., 2007, pp. 161-164). Hask trimming can be used to obtain very small dimensions (Etching a lithographic hard mask to make it more narrow). As a result, small lines in a relatively large pitch result. The ONO width is somewhat wider than the gate length. During ONO breakthrough etching, the sidewall of the poly silicon gate is also lateral etched, leading to smaller gate length.

Figure 10:
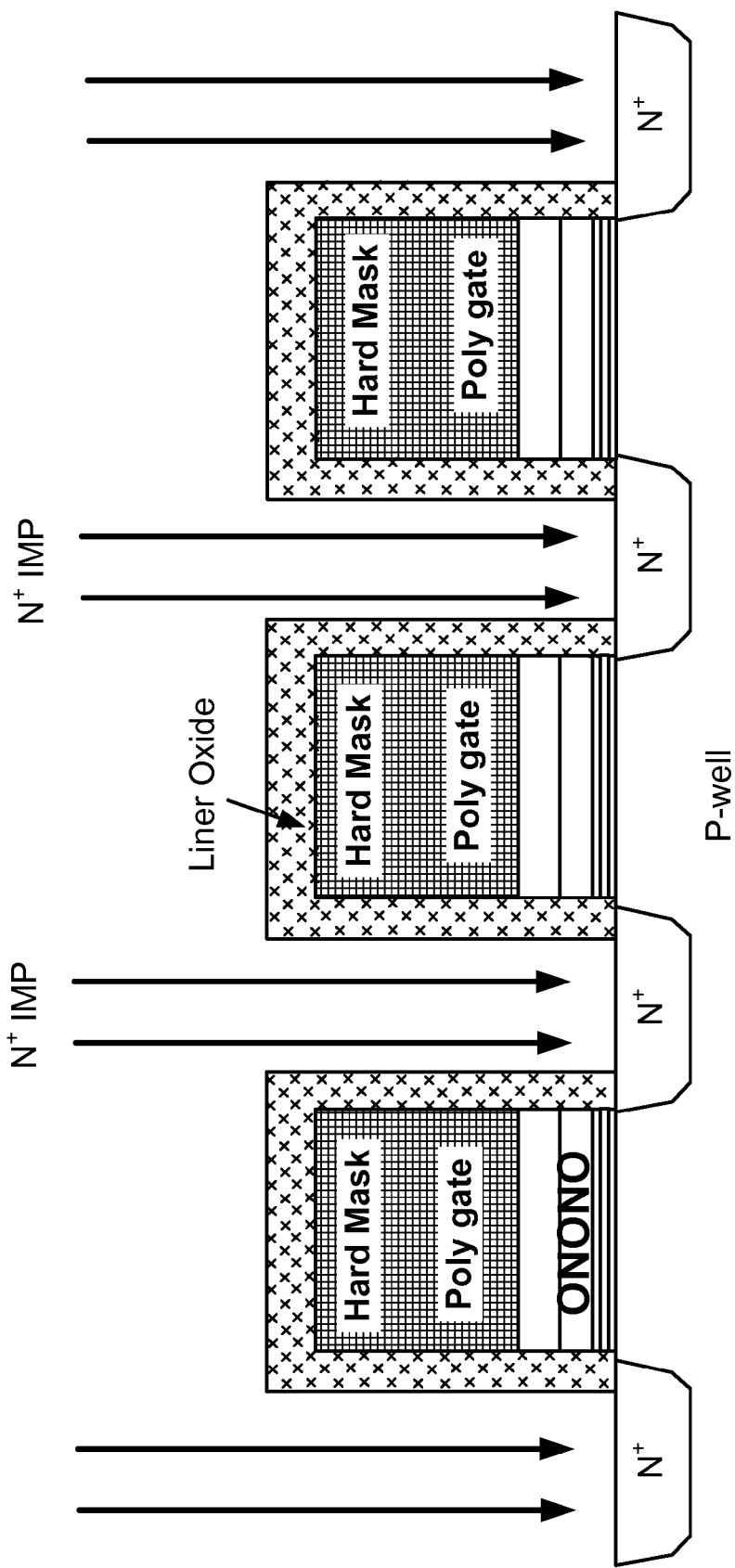
FIG. 10. Drain offset using oxide liner.

In order to provide better short-channel effect, an additional oxide liner can be applied before junction implantation to enlarge the effective channel length as shown in FIG. 10. In FIG. 10, is it shown that a near-planar structure in channel length direction is fabricated, which facilitates the pitch scaling NAND operation is evaluated using a 32-WL NAND array. Typical thickness for the O1/N1/O2/N2/O3 layers are 13/20/25/60/60 Å, respectively. Many identical devices (~1000) have been tested within a whole wafer to provide a clear statistical evaluation. The whole-wafer measurement provides a worst-case estimation for the device variations.

Figure 11A:
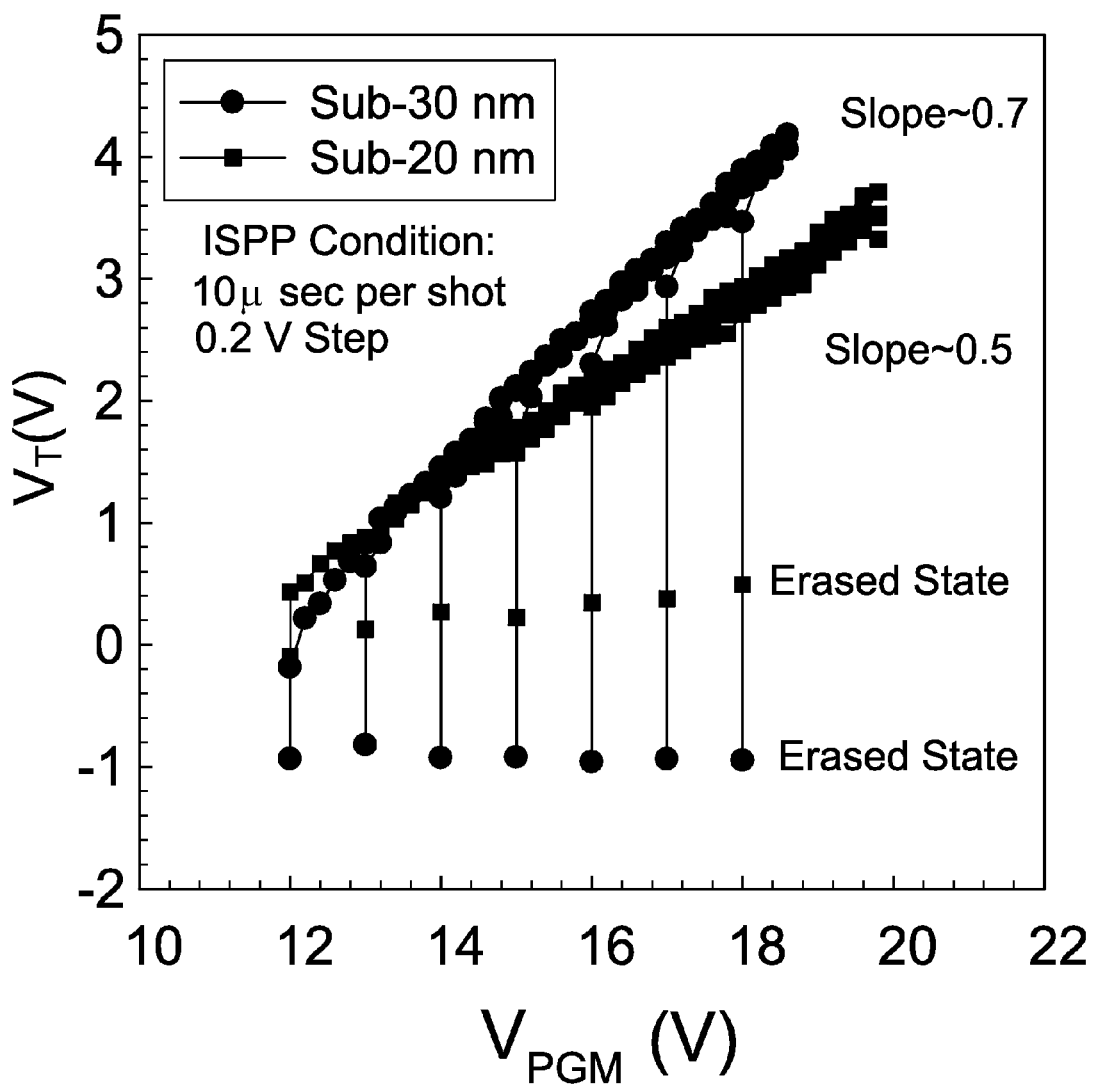
FIG. 11a-11b. (a) ISPP programming and (b) erasing characteristics of sub-20 and sub-30 nm BE-SONOS NAND devices. Sub-20 device shows degraded program/erase efficiency than sub-30 devices.
Figure 11B:
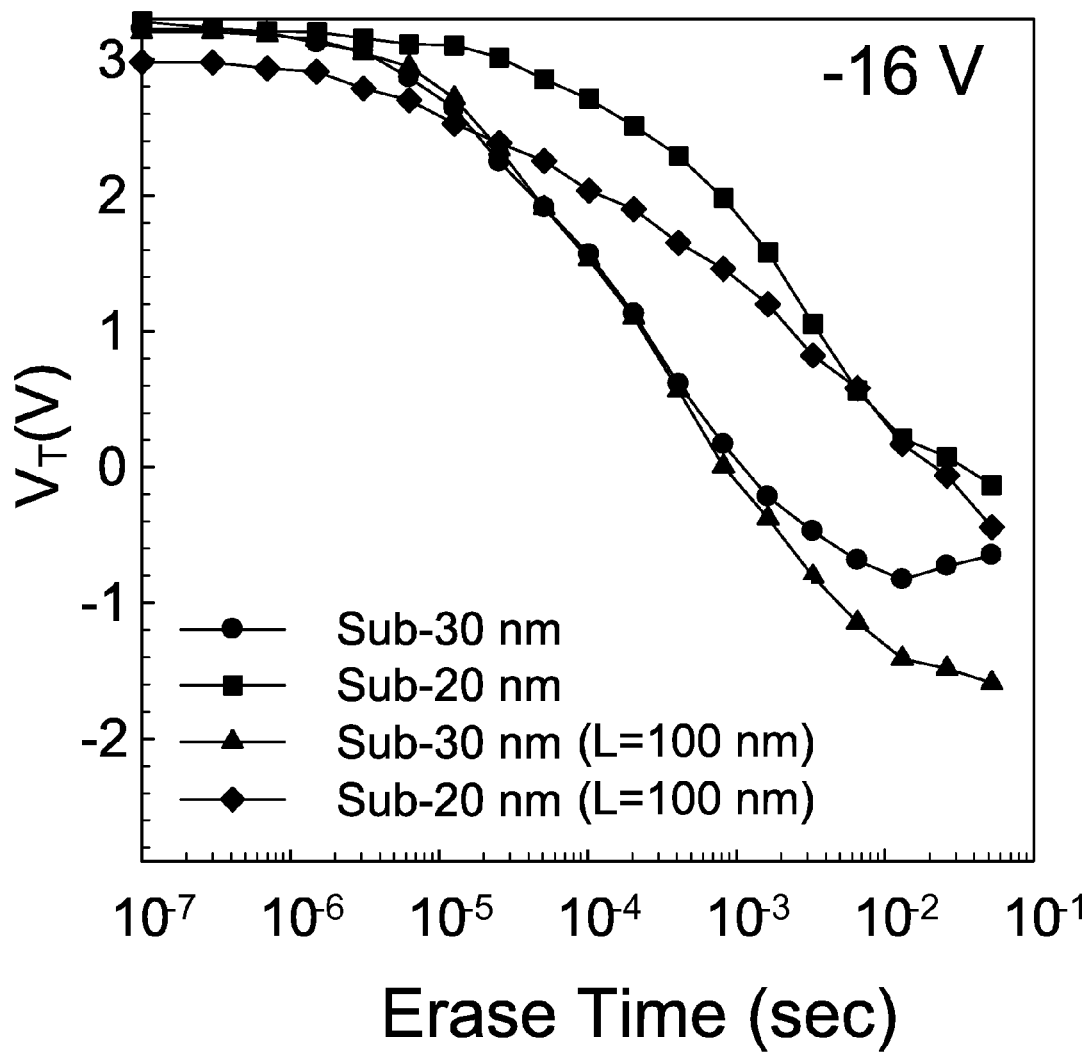

The typical program/erase characteristics of the sub-20 and sub-30 nm BE-SONOS devices are shown in FIGS. 11a-11b. ISPP method is used for programming by applying a constant voltage increment (e.g. 0.2 V) at each successive programming step. FIG. 11(a) shows that ISPP programming is linear (with ISPP slope=0.7 for sub-30 nm device), and converges together for various starting VPGM. The ISPP slope for the sub-20 nm devices is also linear but lower (~0.5) than sub-30 devices.

FIG. 11(b) compares the erase speed. Sub-20 nm device also shows lower erase speed than sub-30 nm devices. At the same channel width, longer channel length shows faster speed and lower erase saturation.

Figure 12:
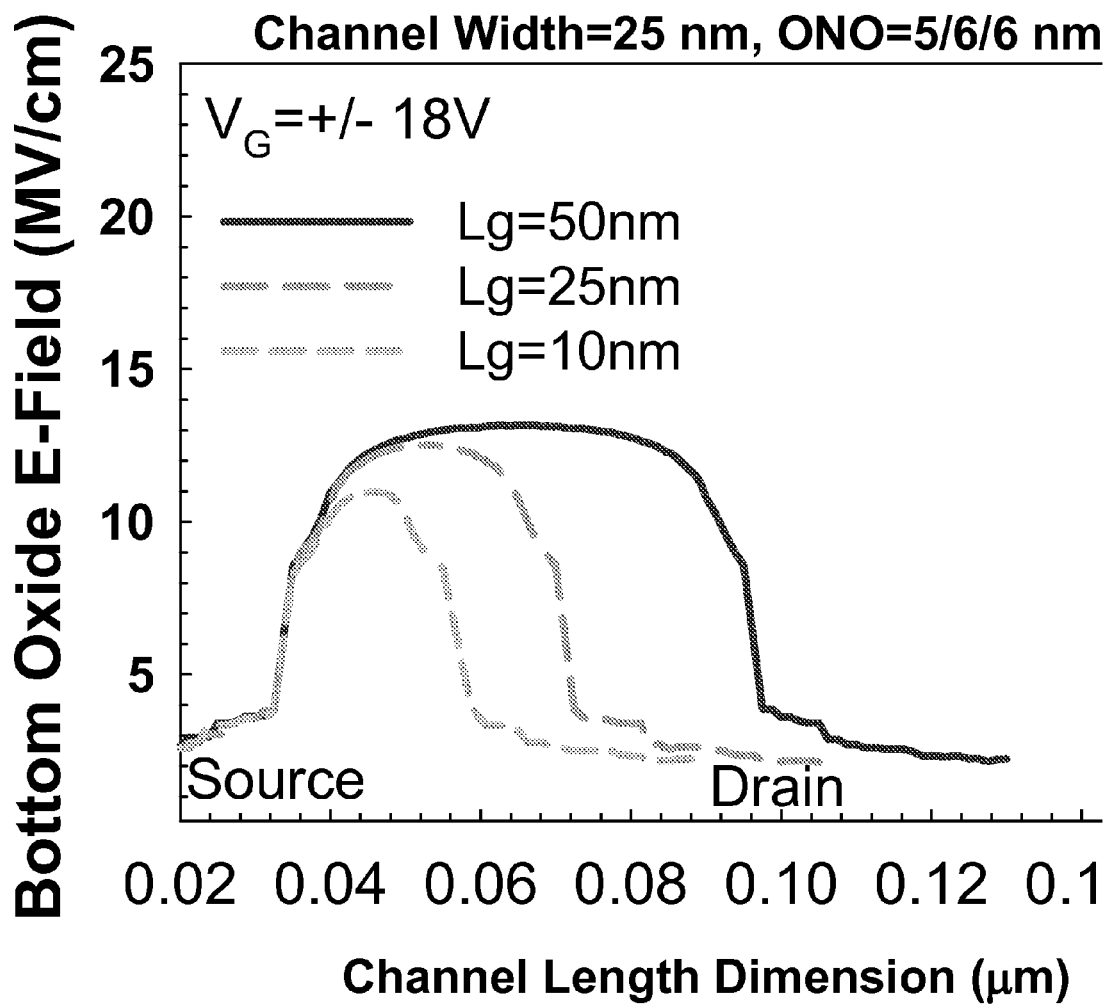
FIG. 12 Bottom oxide E field simulation along the channel length (Lg) direction for various Lg. Smaller channel length shows degraded bottom tunnel oxide field, while increased top oxide field.

FIG. 12 explains the above geometric effects. Since the ONO stack height (~17 nm) is already comparable with the device dimension, significant fringing field exists at the edge. The simulation results show that the bottom oxide electric field is reduced when channel length is scaled down, leading to degraded program/erase efficiency. On the other hand, the electric field across the top oxide is slightly increased, leading to enhanced gate injection and larger erase saturation. The simulation suggests that reducing the ONONO stack height to be much smaller than channel length or width can help to reduce the fringing field and geometry effects. A typical rule of thumb is that the ONONO thickness can be <½ channel length/width to reduce the impact of non-uniformity of the field across the channel due to these fringing fields.

Figure 13A:
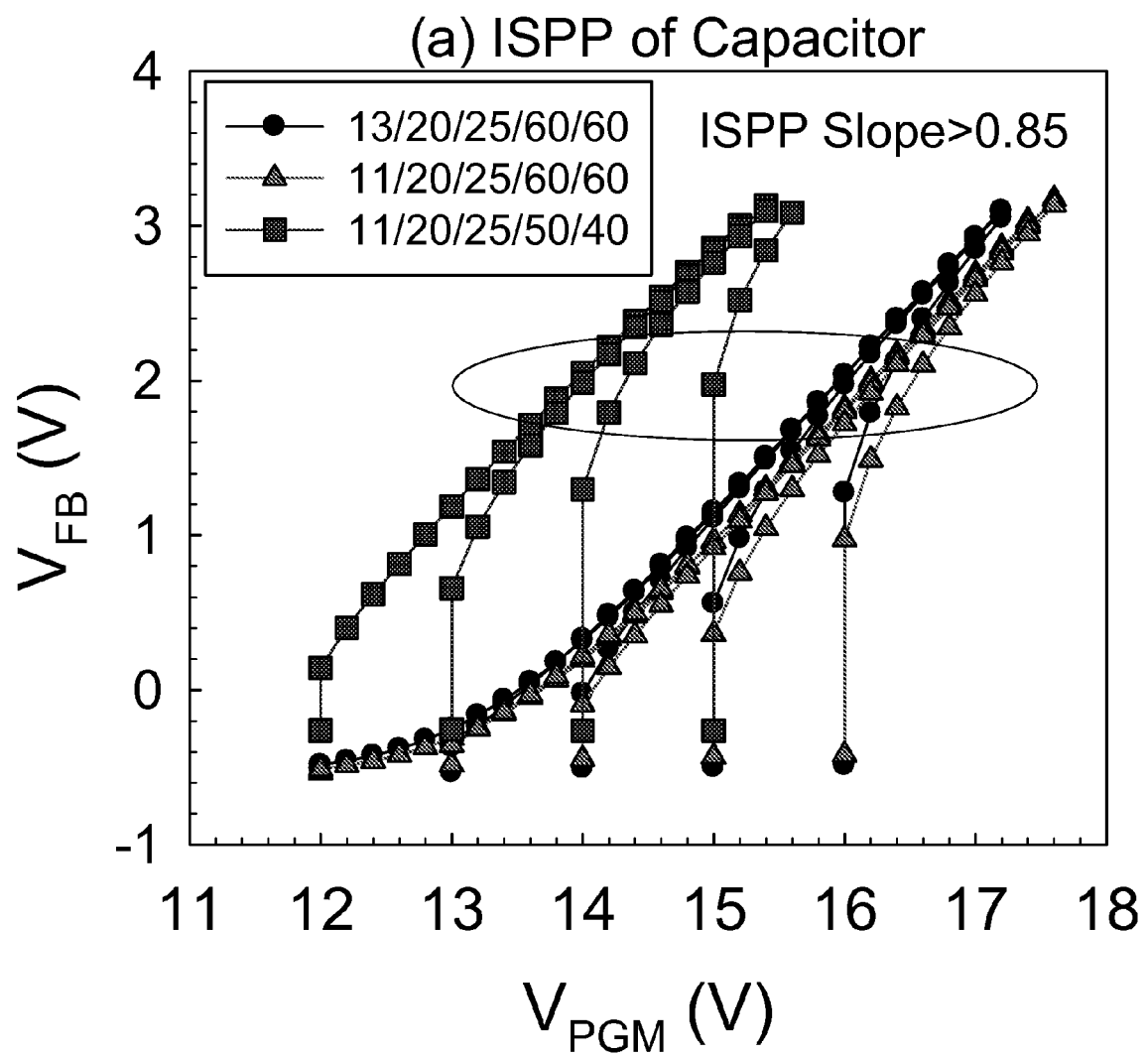
FIG. 13a-13b. ISPP comparison of sub-30 nm BE-SONOS with various EOT. (a) Capacitor. (b) NAND devices. All capacitors show ideal ISPP slope~1, even for very thin BE-SONOS. However, the NAND devices shows lower ISPP slopes.
Figure 13B:
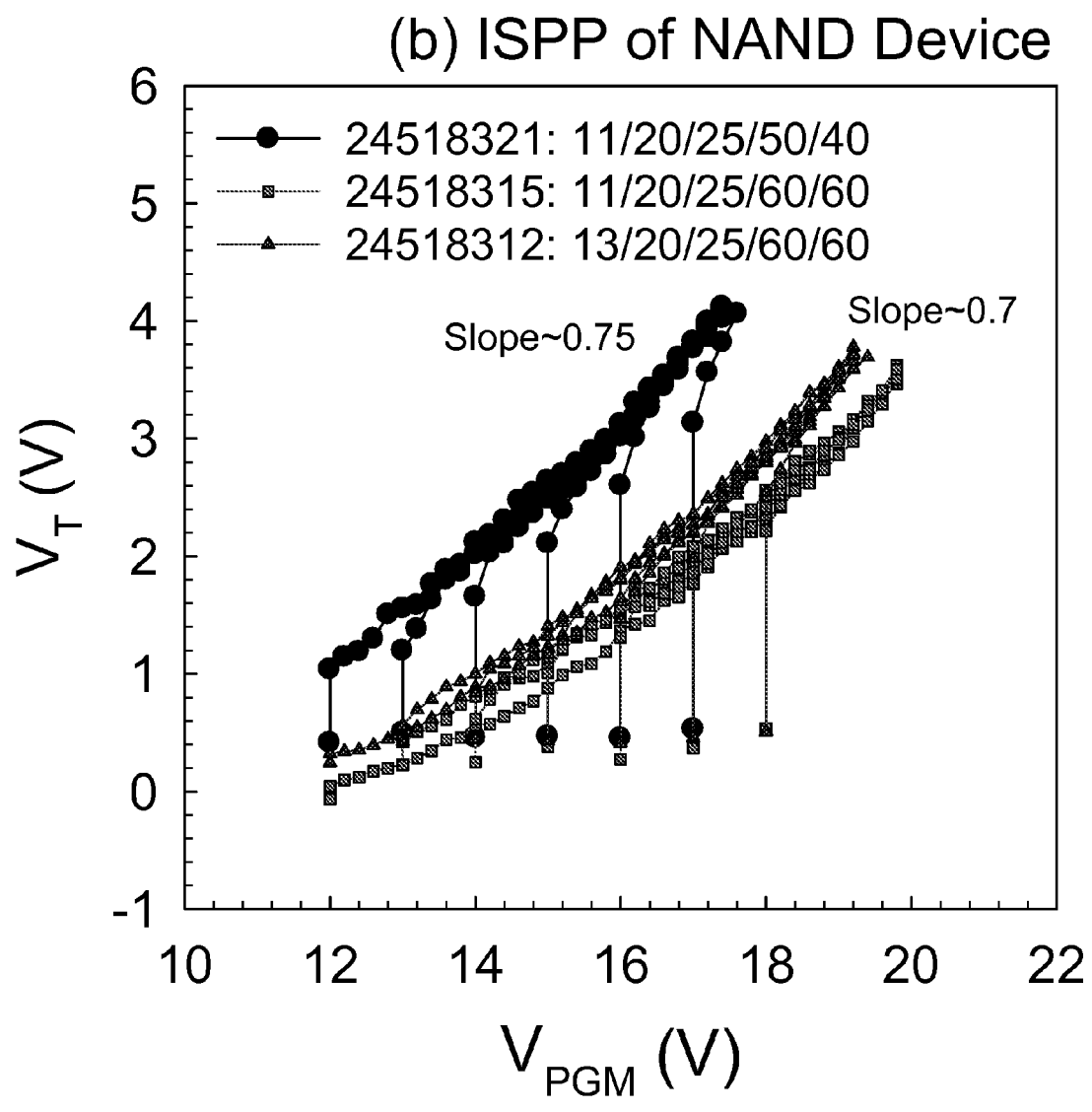

FIGS. 13a-13b compares the ISPP of BE-SONOS with various EOT and O1. All BE-SONOS capacitors (FIG. 13(a)) show ideal linear programming (ISPP slope~1). However, FIG. 13(b) shows that the NAND devices generally has degraded ISPP slope than capacitors. Our previous analysis (See, H. T. Lue et al, in IEDM Tech. Dig., 2007, pp. 161-164) indicates that the STI edge effect degrades the ISPP slope. Through our novel STI pocket implantation, the ISPP slope is well maintained even for the sub-20 nm devices. This fact is of crucial importance, since ISPP programming self-corrects any ONO thickness variation, and provides a tight Vt distribution control.

Figure 14A:
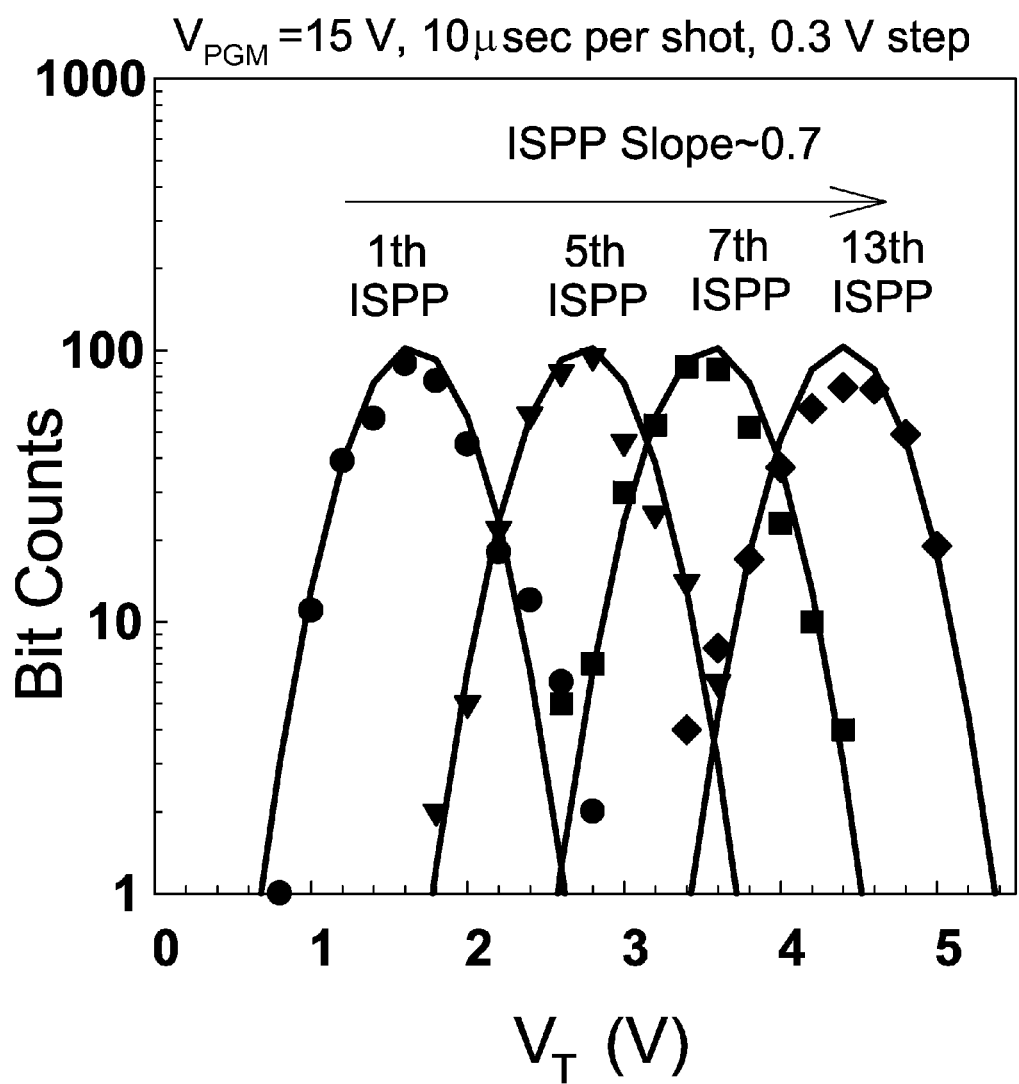
FIG. 14a-14c. (a) Vt distribution (collected from the whole wafer) after dumb-mode ISPP programming (without verify) for sub-30 nm BE-SONOS devices. Program state distribution is uniformly shift with ISPP slope~0.7. (b) Procedure to define the checkerboard pattern of MLC. When the selected cell is program-verified, self-boosting method (Vcc=3.3 V, Vpass=12 V) is applied for program-inhibit. (c) Vt distribution using ISPP and self-boosting methods. Many identical NAND arrays are tested. The final distribution of cell A (PV1) is only slightly broadened because of the program disturb. Tight distribution is obtained within the whole wafer.

The Vt distribution during dumb-mode ISPP programming (without program-verify) is shown in FIG. 14(a). Although the distribution is wide (measured for the whole wafer), the programmed-state has a Gaussian distribution, and is uniformly shifted during ISPP. This behavior is consistent with FIGS. 13a-b, since ISPP slope are similar for all the devices. The well-behaved ISPP is a critical attribute for BE-SONOS that enables tight Vt distribution.

Figure 14B:
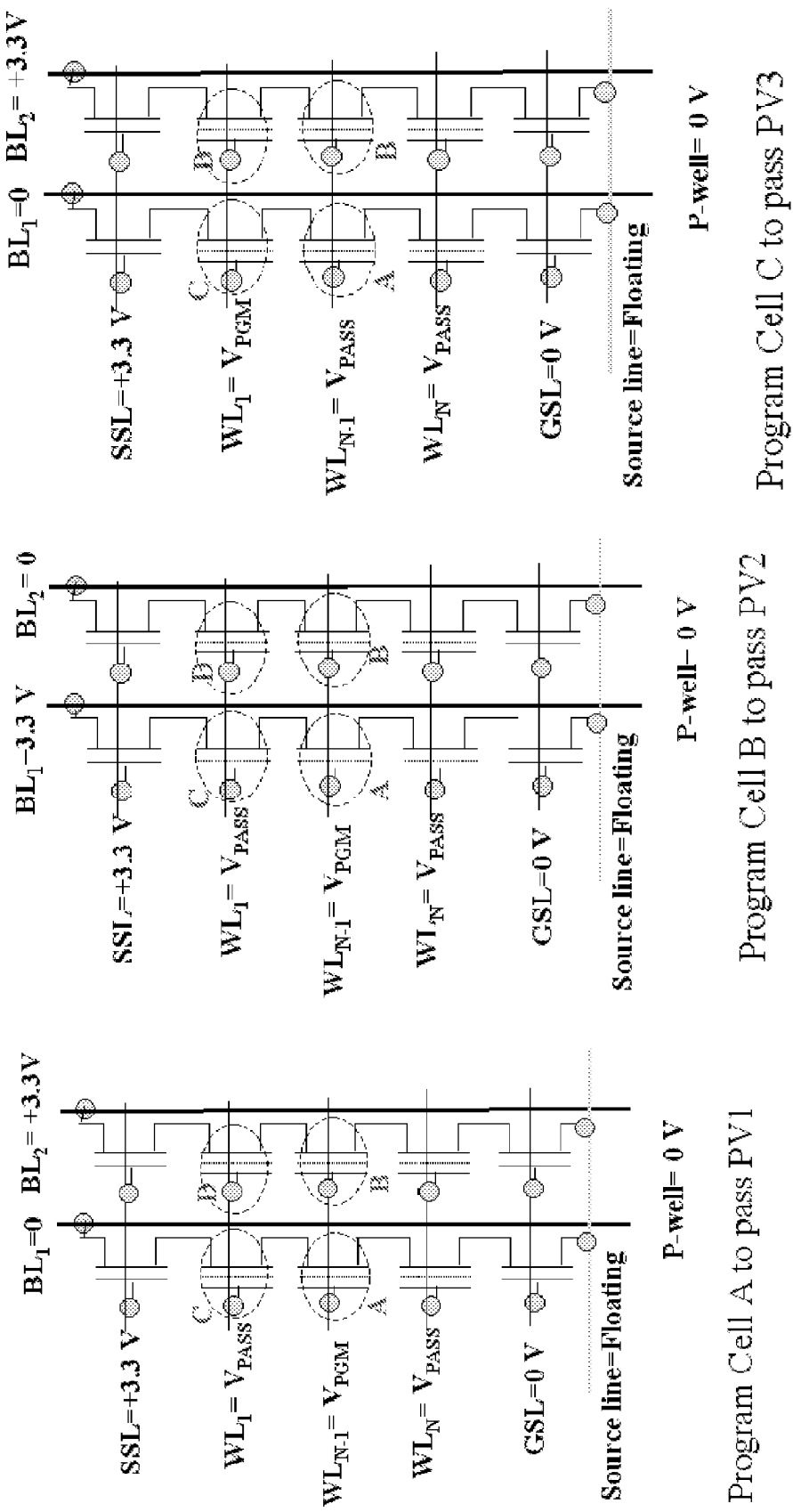
Figure 14C:
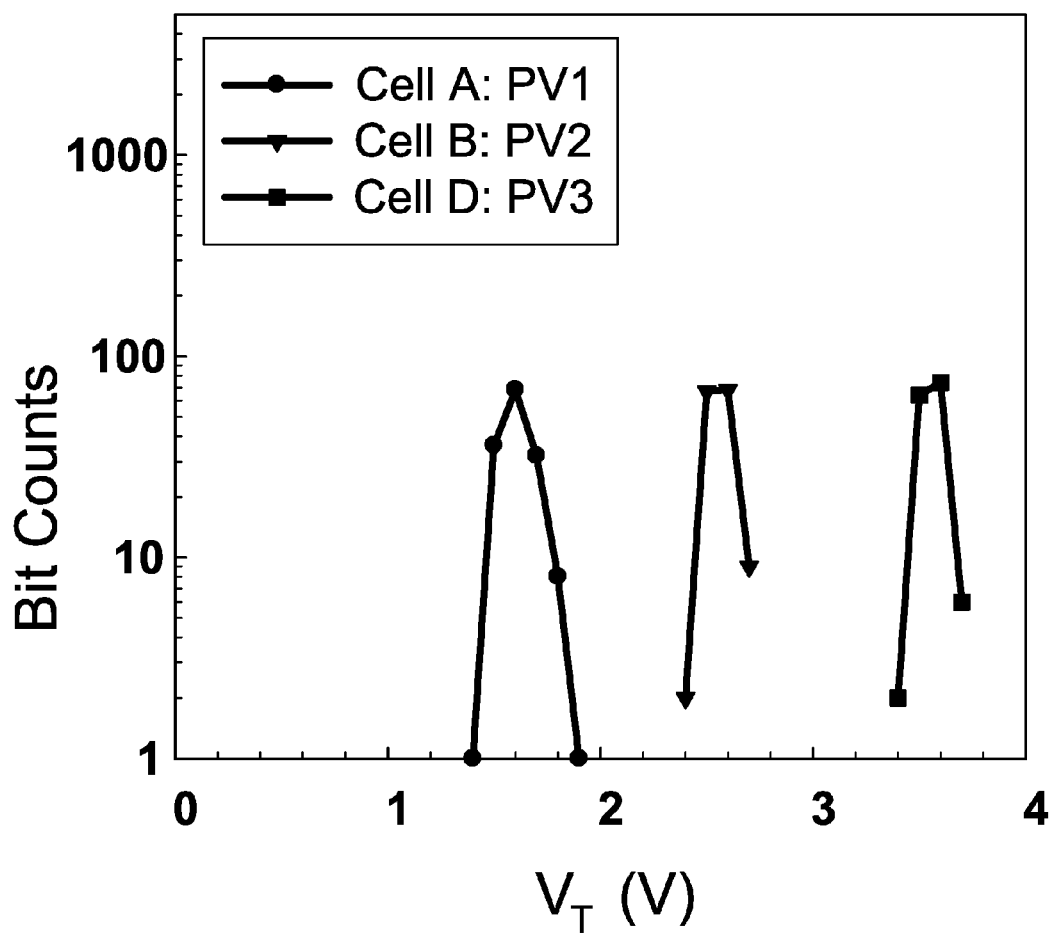

A checkerboard pattern with adjacent cells defined at different levels (A, B, C, D) are designed to study the MLC window (FIG. 14(b)). After cell A is programmed using ISPP, self-boosting method is applied and cell B is continuously programmed. Likewise for cell C and D. We apply the same testing procedure within the whole wafers. The results in FIG. 14(c) prove that ISPP together with self-boosting method provides a tight Vt distribution for the sub-30 nm, multilevel cell MLC BE-SONOS NAND.

Figure 15:
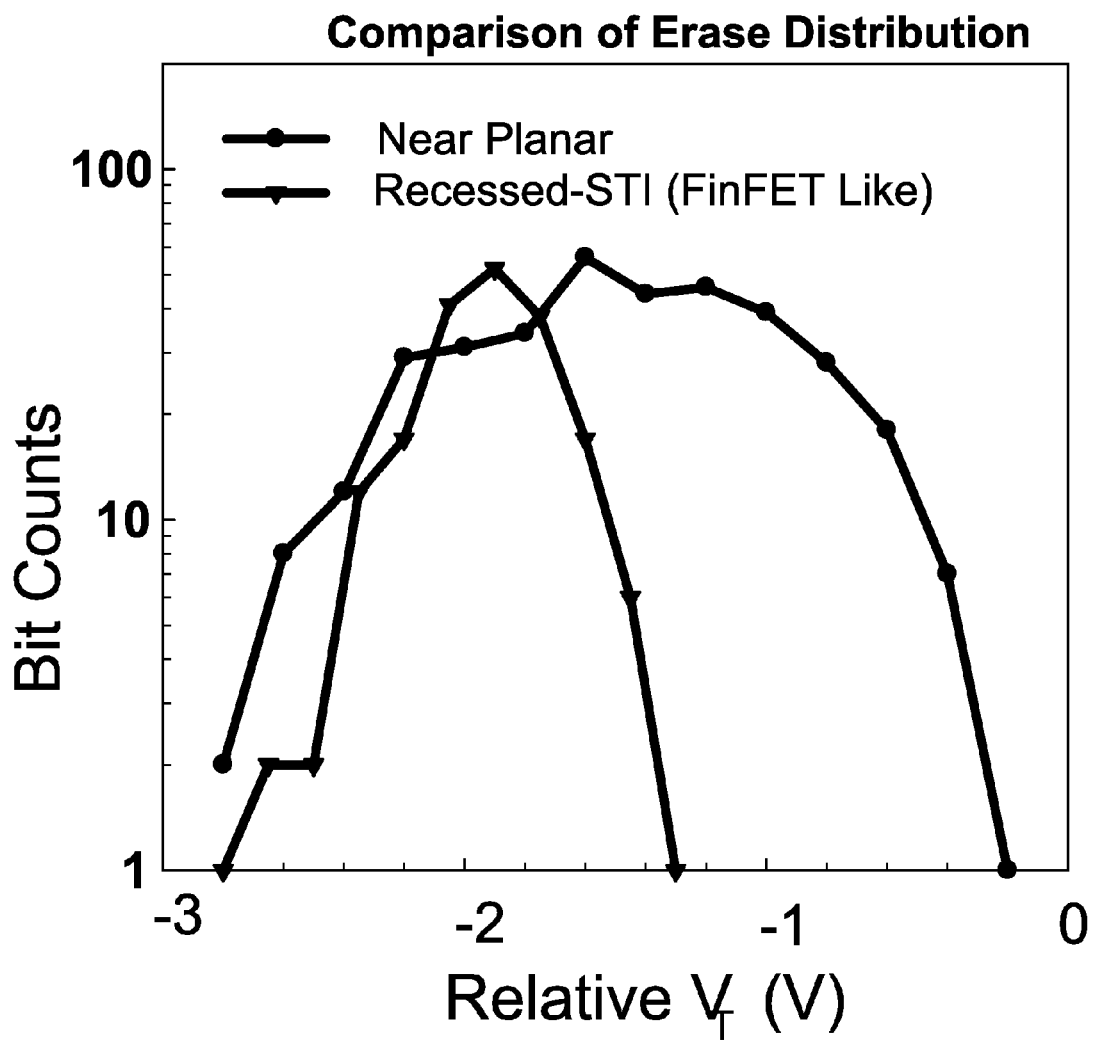
FIG. 15. Comparison of erased state distribution for the near-planar and recessed-STI (FinFET-like) structures. Recessed-STI shows lower erased Vt and smaller distribution.

Erase distribution is shown in FIG. 15. In general the erase distribution is wide, and there is some erase saturation. However, we found that recessed-STI shows lower erased Vt distribution than near-planar structure. This is due to the larger field enhancement effect (see, T. H. Hsu et al, in IEDM Tech. Dig., 2007, pp. 913-916). This offers a promising way to solve the erase saturation.

Figure 16:
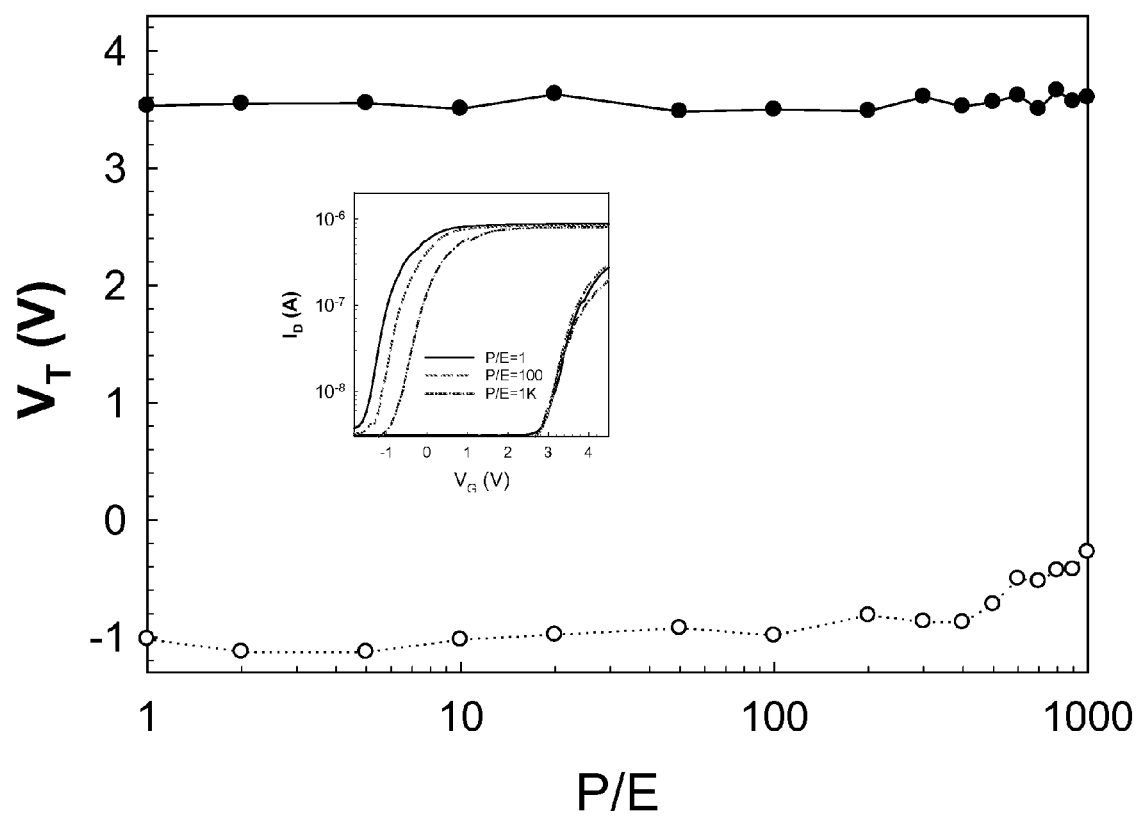
FIG. 16. Typical P/E cycling endurance of sub-30 nm NAND cell. The inset shows the S.S. and gm during cycling. The inset shows the corresponding IV curve.

Typical endurance is shown FIG. 16. The endurance is worse when technology is scaled down. This is probably because the corner edge plays more important role, which degrades reliability upon scaling.

Figure 17:
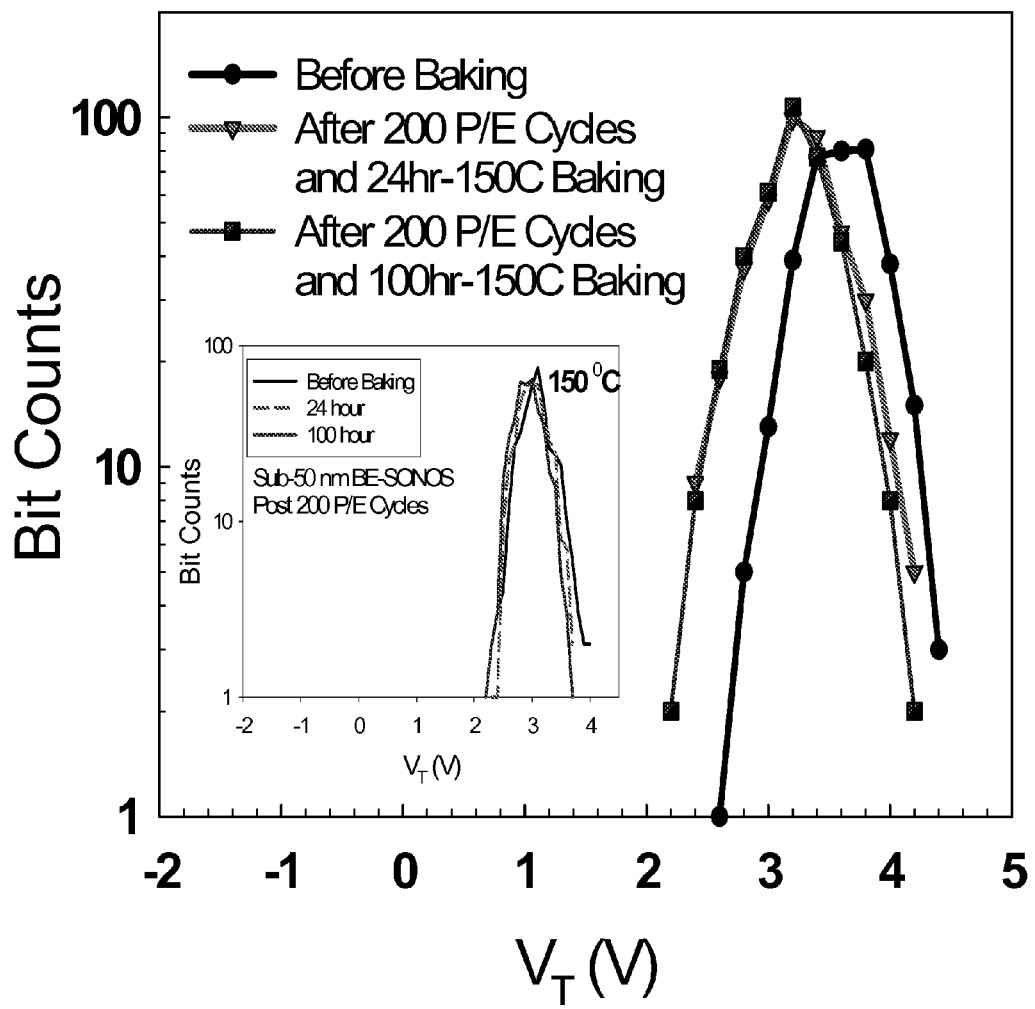
FIG. 17. 1500C retention of the sub-30 nm BE-SONOS NAND devices after 200 P/E cycling. Excellent few-electron storage (<50) is demonstrated. The inset shows the retention of the sub-50 nm BE-SONOS for comparison.

The stored electron number for the sub-30 nm BE-SONOS device are estimated to be 50~100 (trap density (~$10^{13}$/cm$^2$) times the channel area). FIG. 17 shows the excellent retention performance of sub-30 nm BE-SONOS. Although it shows slightly degraded retention than the sub-50 nm BE-SONOS (inset), it can surpass very long-term (>100 hour) high-temperature baking. This proves that BE-SONOS has excellent few-electron (<100) storage capability.

Figure 18A:
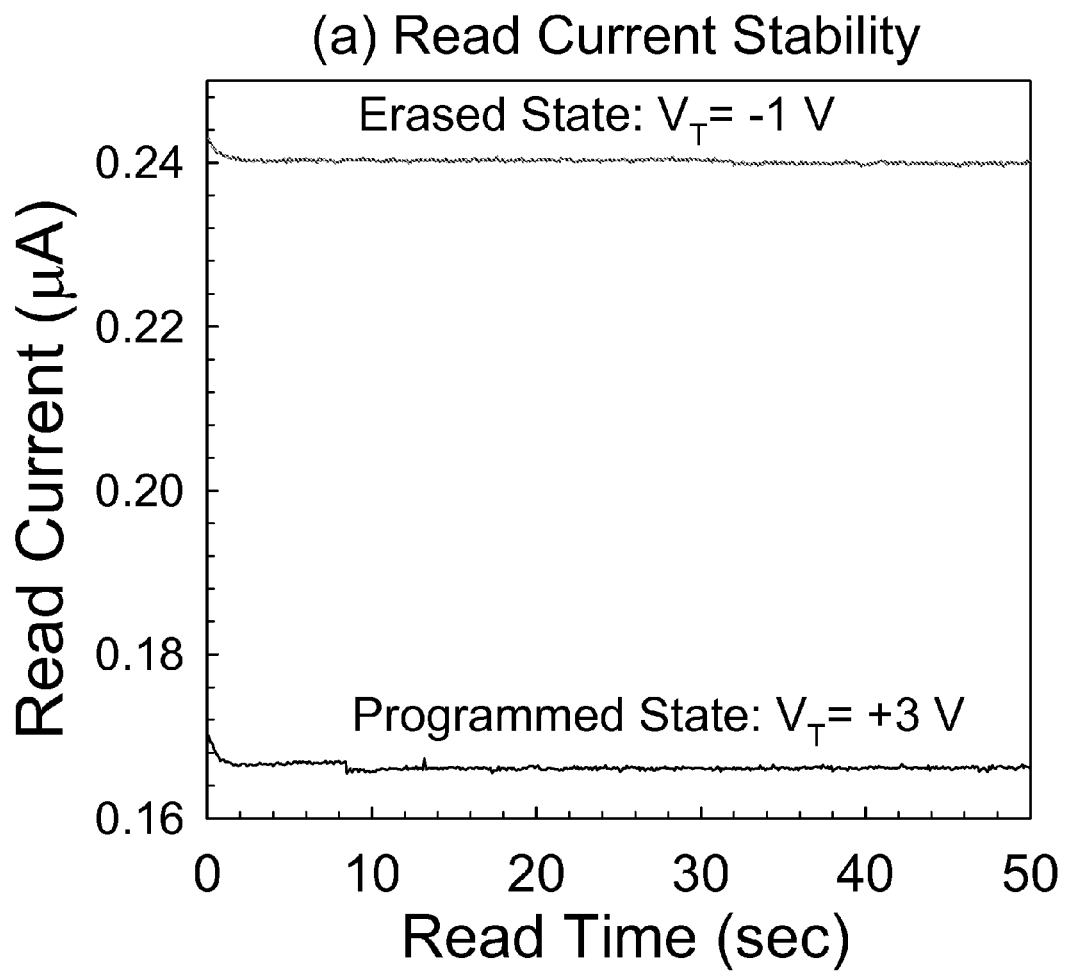
FIGS. 18a-c. (a) Read current stability measurement for the sub-20 nm BE-SONOS NAND device. A constant voltage is applied at pass gates and select gates to continuously read the NAND string current. (b) Pulse IV measurement results for a single cell using Keithley 4200 system. Read current is stable from μsec to msec, indicating no transient charge-trapping/de-trapping issues. (c) Read disturb life time evaluation. Various large gate voltage is applied to accelerate the read disturb. Read disturb can exceed 1M read cycles (assuming 1 msec read time for each read).
Figure 18B:
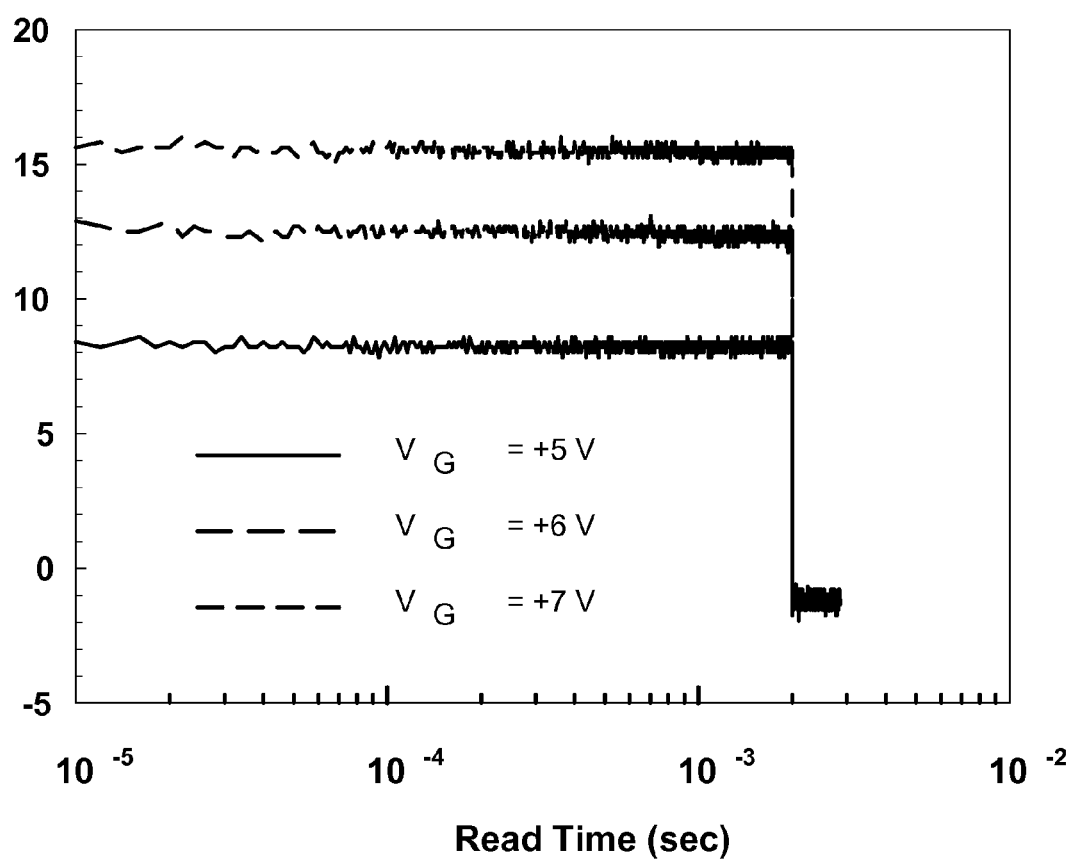
Figure 18C:
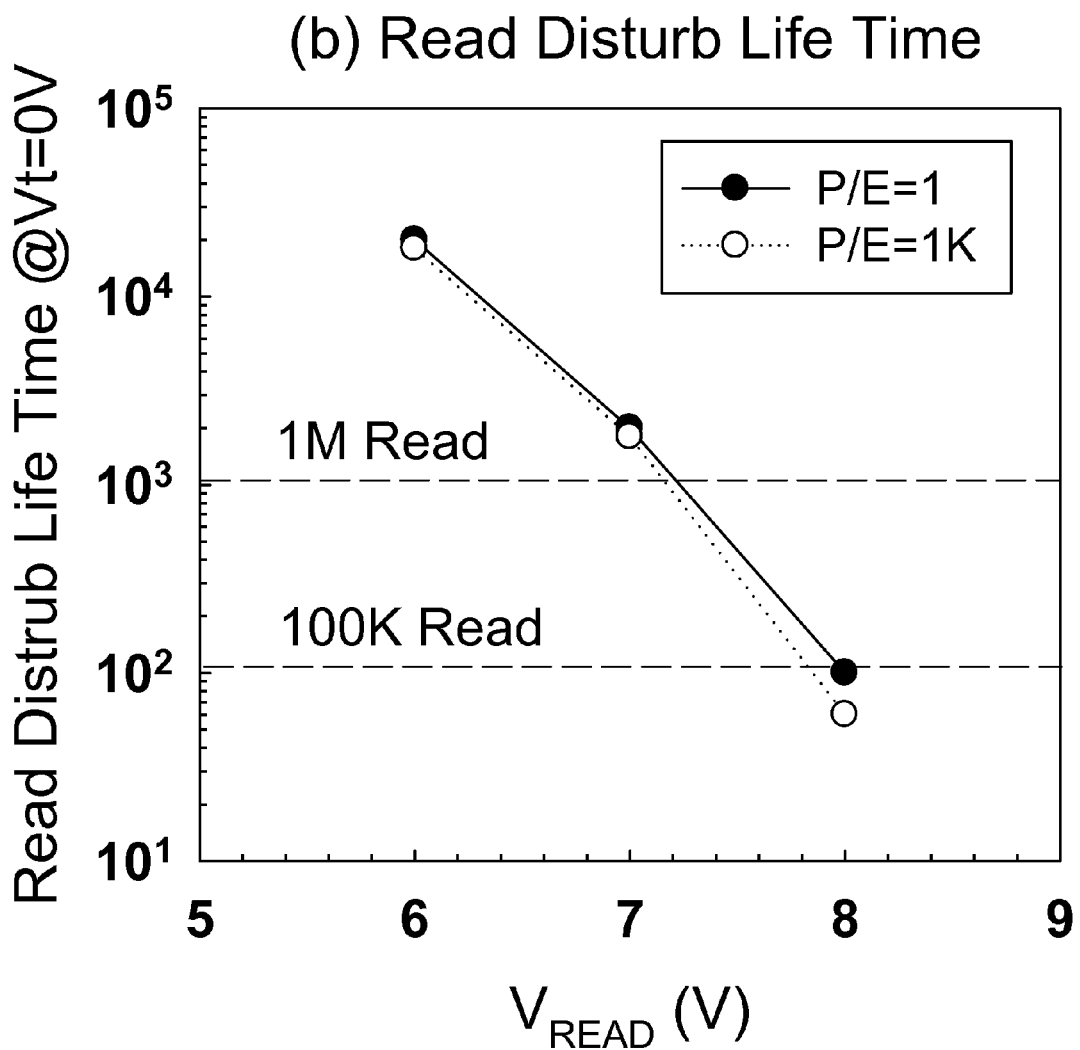

The read current stability under continuous reading is shown in FIGS. 18a-c. The current fluctuation is very small even though the device is very small. The inset shows evaluation of BE-SONOS using pulse-IV technique. Pulse-IV measurements show no transient response from μsec to msec ranges. This shows that there is no transient charge trapping de-trapping during operation.

Read disturb life time is evaluated using a larger pass gate voltage for acceleration. The sub-30 nm BE-SONOS can sustain 1M read cycles at Vread<7 V.

Sub-20 nm BE-SONOS NAND is demonstrated. Excellent few electron storage and tight Vt distribution control capabilities are demonstrated.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory cell, comprising:
   a first source/drain terminal and a second source/drain terminal, the first and second source/drain terminals having a first conductivity type;
   a channel between the first and second source/drain terminals, the channel having a second conductivity type, the channel having a channel length extending from the first source/drain terminal to the second source/drain terminal, and a width orthogonal to the length extending from a first side to a second side of the channel;
   the channel including a lateral pocket of dopants having the second conductivity type along at least one of the first and second sides, so that the channel has a profile of concentration of dopants of the second conductivity type that is higher in the lateral pocket than in a central region of the channel;
   a charge trapping structure overlying the channel; and
   a gate over the charge trapping structure.

2. The memory cell of claim 1, wherein the channel, charge trapping structure and gate are arranged such that the charge trapping structure has a thickness between the gate and the channel that is greater along the at least one side than in the central region.

3. The memory cell of claim 1, including an insulation material along the sides of the channel.

4. The memory cell of claim 1, wherein the charge trapping structure includes a multilayer dielectric stack, including a first tunneling layer on the channel comprising silicon oxide or silicon oxynitride, a second charge trapping layer on the tunneling layer, and a blocking layer between the charge trapping layer and the gate, and including trenches along the sides of the channel filled with insulation material comprising silicon oxide or silicon oxynitride.

5. The memory cell of claim 1, wherein the charge trapping structure includes a multilayer dielectric stack, including a multilayer tunneling layer on the channel comprising a first layer of silicon oxide or silicon oxynitride less than 2 nm thick in the central region, a second layer of silicon nitride less than 2.5 nm thick in the central region, and a third layer comprising silicon oxide or silicon oxynitride less than 3.5 nm thick in the central region; a charge trapping layer on the tunneling layer, the charge trapping layer comprising silicon nitride greater than 5 nm thick in the central region, and a blocking layer between the charge trapping layer and the gate, the blocking layer comprising an insulation material having an effective oxide thickness greater than 5 nm in the central region, and including trenches along the sides of the channel filled with insulation material comprising silicon oxide or silicon oxynitride.

6. An integrated circuit device, comprising:
   a semiconductor substrate including a memory array area;
   a plurality of insulator-filled trenches arranged in columns in the memory array area of the substrate, with corresponding strips of the semiconductor substrate therebetween, respective strips of the semiconductor substrate including
      a plurality of spaced apart source/drain terminals having a first conductivity type;
      a plurality of channels between the adjacent source/drain terminals, the channels having a second conductivity type, the channels having channel lengths extending from a first adjacent source/drain terminal to a second adjacent source/drain terminal, and having widths orthogonal to the lengths extending from a first side to a second side of the channel;
      the channels including a lateral pocket of dopants having the second conductivity type along the first and second sides, so that the channels have respective profiles of concentration of dopants of the second conductivity type that are higher in the lateral pockets than in central regions of the channels;
   a plurality of charge trapping structures overlying the channels; and
   a plurality of wordlines arranged in rows over the charge trapping structures and the channels in the strips of the semiconductor substrate;
   a plurality of bit lines arranged to connect to corresponding strips in the plurality of strips;
   whereby a NAND-architecture array of charge trapping memory cells is provided on the integrated circuit.

7. The memory cell of claim 6, wherein the channel, charge trapping structure and gate are arranged such that the charge trapping structure has a thickness between the gate and the channel that is greater along the first and second sides than in the central region.

8. The memory cell of claim 6, wherein the charge trapping structure includes a multilayer dielectric stack, including a first tunneling layer on the channel comprising silicon oxide or silicon oxynitride, a second charge trapping layer on the tunneling layer, and a blocking layer between the charge trapping layer and the gate, and wherein the insulation material in the trenches comprises silicon oxide or silicon oxynitride.

9. The memory cell of claim 6, wherein the charge trapping structure includes a multilayer dielectric stack, including a multilayer tunneling layer on the channel comprising a first layer of silicon oxide or silicon oxynitride less than 2 nm thick in the central region, a second layer of silicon nitride less than 3 nm thick in the central region, and a third layer comprising silicon oxide or silicon oxynitride less than 3.5 nm thick in the central region; a charge trapping layer on the tunneling layer, the charge trapping layer comprising silicon nitride greater than 5 nm thick in the central region, and a blocking layer between the charge trapping layer and the gate, the blocking layer comprising an insulation material having an effective oxide thickness greater than 5 nm in the central region, and the insulation material in the plurality of trenches comprises silicon oxide or silicon oxynitride.

* * * * *